United States Patent
Chanumolu et al.

(10) Patent No.: US 10,811,375 B2
(45) Date of Patent: Oct. 20, 2020

(54) SYSTEM, METHOD AND APPARATUS FOR A SINGLE INPUT/OUTPUT CELL LAYOUT

(71) Applicant: Arm Limited, Cambridge (GB)

(72) Inventors: Kishan Chanumolu, Bangalore (IN); Vijaya Kumar Vinukonda, Bangalore (IN)

(73) Assignee: Arm Limited, Cambridge (GB)

( * ) Notice: Subject to any disclaimer, the term of this patent is extended or adjusted under 35 U.S.C. 154(b) by 25 days.

(21) Appl. No.: 16/186,919

(22) Filed: Nov. 12, 2018

(65) Prior Publication Data

US 2020/0152588 A1 May 14, 2020

(51) Int. Cl.
*H01L 23/00* (2006.01)

(52) U.S. Cl.
CPC .... *H01L 24/06* (2013.01); *H01L 2224/06135* (2013.01)

(58) Field of Classification Search
CPC ...................................................... H01L 24/06
See application file for complete search history.

(56) References Cited

U.S. PATENT DOCUMENTS 6,163,042 A * 12/2000 Mizushima ......... H01L 27/0207
257/202

\* cited by examiner

*Primary Examiner* — William A Harriston
(74) *Attorney, Agent, or Firm* — Leveque IP Law, P.C.

(57) ABSTRACT

An I/O ring formed by a single type of I/O cell. The I/O cell has a substantially square shape in which the height and width dimensions are substantially equal. Each I/O cell has an X-axis and a Y-axis, where the two or more I/O cells are mounted adjacent on an axis by flipping every alternate I/O cell about another axis to share a vertical bus between the two I/O cells. Each I/O cell has a power pin portion and a ground pin portion to be dimensioned to be approximately one-half a designated power pin region and ground pin portion, respectively.

19 Claims, 23 Drawing Sheets

SYSTEM, METHOD AND APPARATUS FOR A SINGLE INPUT/OUTPUT CELL LAYOUT

BACKGROUND

Generally, input/output ("I/O", or "IO") pad cells are placed around the periphery of a chip edge in a ring form, called the I/O ring, or pad frame. The I/O cell facilitates an interface between the chip core and an external board through a package such as wirebond package or flipchip package.

These I/O cells were traditionally rectangular (i.e., relatively thin and tall) with the shorter edge surface facing toward the chip edge in order to accommodate a higher number of I/O pad cells in the given pad frame.

BRIEF DESCRIPTION OF THE DRAWINGS

The accompanying drawings provide visual representations, which will be used to more fully describe various representative embodiments and can be used by those skilled in the art to better understand the representative embodiments disclosed and their inherent advantages. In these drawings, like reference numerals identify corresponding elements.

DETAILED DESCRIPTION

Figure 1:
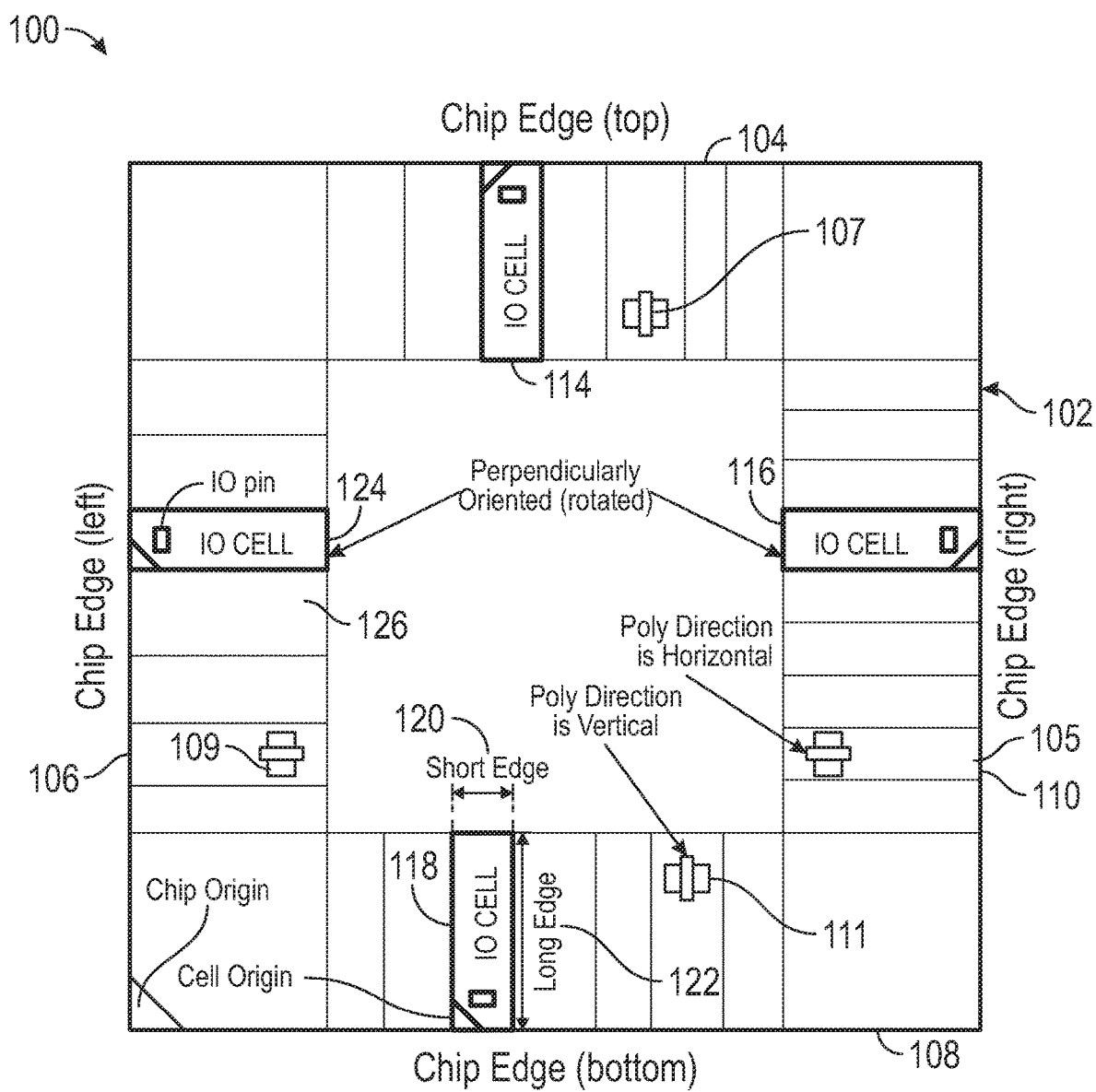
FIG. 1 illustrates an I/O ring or pad frame.

While this disclosure is susceptible of embodiment in many different forms, there is shown in the drawings and will herein be described in detail specific embodiments, with the understanding that the present disclosure is to be considered as an example of the principles described and not intended to limit the disclosure to the specific embodiments shown and described. In the description below, like reference numerals are used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprise", "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Reference throughout this document to "one embodiment", "certain embodiments", "an embodiment" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

A "module" as used herein describes a component or part of a program or device that can contain hardware or software, or a combination of hardware and software. In a module that includes software, the software may contain one or more routines, or subroutines. One or more modules can make up a program and/or device.

FIG. 1 illustrates I/O pad cell configured to form an I/O ring, that can be mounted on a chip, collectively 100. The embodiment 100 includes an I/O ring on a chip 102 that has four edges 104, 106, 108 and 110. These edges 104, 106, 108 and 110 are shown as top, left, bottom and right, respectively, for illustration purposes. Any orientation of the I/O ring on the chip 102 is an embodiment of this disclosure. I/O cells 114, 124, 118 and 116 are mounted on sides 104, 106, 108 and 110, respectively. I/O cell 124 shows I/O pin 126 and I/O cell 118 shows shorter edge 120 and longer edge 122. I/O cell 105 and I/O cell 109 are horizontal. I/O cell 107 and I/O cell 111 are vertical.

Furthermore, as can be seen in FIG. 1, the I/O cell 124 on the left edge 106 and the I/O cell 116 on the right edge 110 are oriented perpendicular to the same I/O cell 114 and 118 placed on top edge 104 and bottom edge 108, respectively, of the I/O ring 102, where gate poly orientation is not restricted to a single common direction, i.e. transistors can have both vertical gate poly as well as horizontal gate poly on the same chip.

Deep sub-micron technologies below 28 nm (nanometer) are restricted with a single common poly direction across the chip. Not just a gate poly of thin transistors, there are other devices such as thick transistors, poly resistors, poly bound diodes etc. are also restricted to a single common direction in FinFet technologies. The same IO pad cell can be used on the opposite sides of the chip but cannot be oriented perpendicular or reused on the adjacent sides of the chip if the technology restricts to a single common poly direction.

Figure 2:
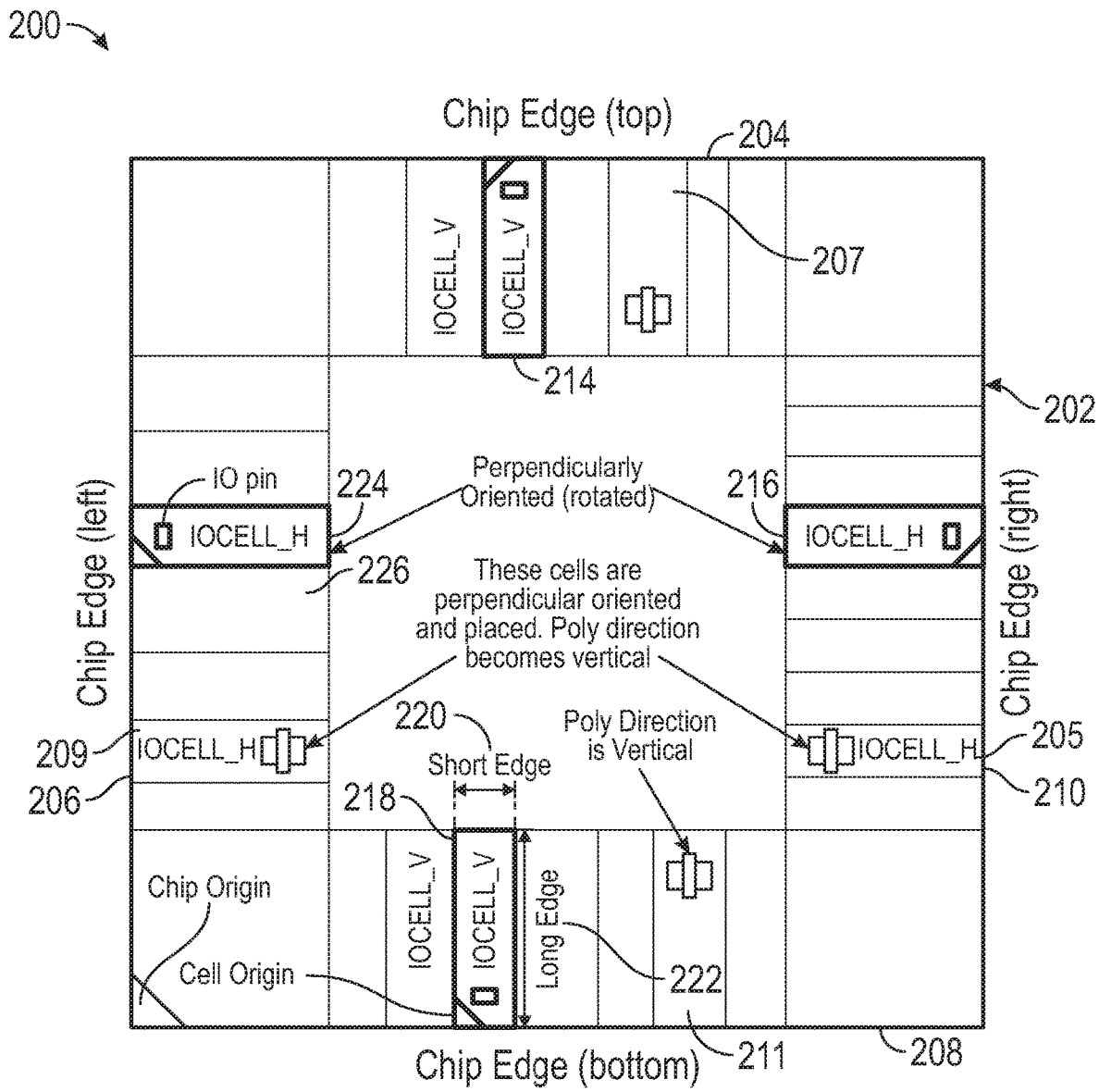
FIG. 2 illustrates an I/O ring using an I/O cell with a horizontal poly orientation and an I/O cell with a vertical poly orientation.

FIG. 2 illustrates an embodiment 200 of I/O pad ring on a chip 202 using I/O cells with a horizontal poly orientation and 10 cells with a vertical poly orientation. The restriction of a common poly direction has created the desire to design a separate version of a I/O pad cell layout (I/O CELL HORIZONTAL) for the same circuit, with perpendicular poly direction within the I/O cell layout, so that when this I/O cell is placed on the adjacent side with perpendicular orientation, it produces a common poly orientation in the chip.

The embodiment 200 shown in FIG. 2 includes an I/O ring, which may include a chip, 202 that has four edges 204 (top), 206 (left-side), 208 (bottom) and 210 (right-side). Any orientation of the chip and/or I/O ring 202 is an embodiment of this disclosure. I/O cells 214, 224, 218 and 216 are mounted on sides 204, 206, 208 and 210, respectively. I/O cell 224 shows I/O pin 226 and I/O cell 218 shows shorter edge 220 and longer edge 222. I/O cell 205 and I/O cell 209 are with horizontal poly orientation. I/O cell 207 and I/O cell 211 are with vertical poly orientation.

Furthermore, as can be seen in FIG. 2, the I/O cell 224 on the left edge 206 and the I/O cell 216 on the right edge 210 are oriented perpendicular to the similar I/O cell 214 and 218 placed on top edge 204 and bottom edge 208, respectively, of the chip 202, respectively. I/O cell 209 and 10 cell 205 are perpendicular orientated and placed so the poly direction becomes common across the SOC.

Figure 3:
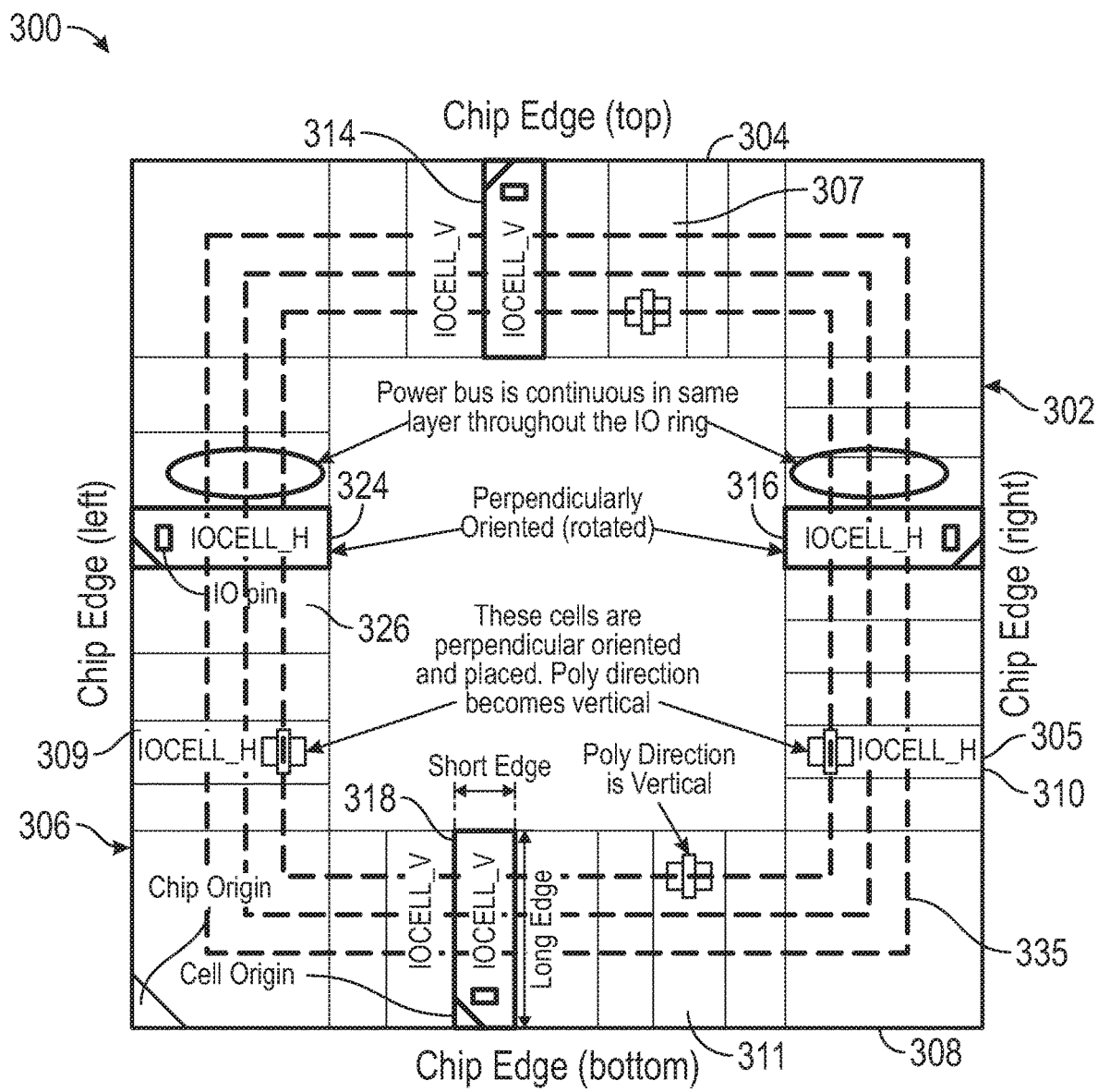
FIG. 3 illustrates a power bus structure in an I/O cell and I/O ring.

FIG. 3 illustrates an embodiment 300 of a power bus structure in an I/O ring 302.

FIG. 3 includes chip and I/O ring 302 that has four edges 304 (top), 306 (left-side), 308 (bottom) and 310 (right-side). I/O cells 314, 324, 318 and 316 are mounted on sides 304, 306, 308 and 310, respectively. I/O cell 324 shows I/O pin 326. I/O cell 305 and I/O cell 309 are perpendicular and placed so that the poly direction becomes common across the chip. I/O cell 307 and I/O cell 311 are with vertical poly orientation.

Furthermore, as can be seen in FIG. 3, a power bus 335 is continuous in the same layer throughout the I/O ring 302. The I/O cell 324 on the left edge 306 and the I/O cell 316 on the right edge 310 are oriented perpendicular.

The perpendicularly oriented (I/O CELL HORIZONTAL) may not be congruent with the non-perpendicularly oriented cell (I/O CELL VERTICAL) in various performance metrics. For high speed I/O cells, it is useful to match the layout dependent effects of these I/O cells as close as possible irrespective of the orientation and placement location in the chip. Since these two cells are layout designed independently, different layout effects are acting differently on the same circuit, creating performance differences in the silicon. In few cases, Vertical I/O cell size is different from Horizontal I/O cell height.

Figure 4:
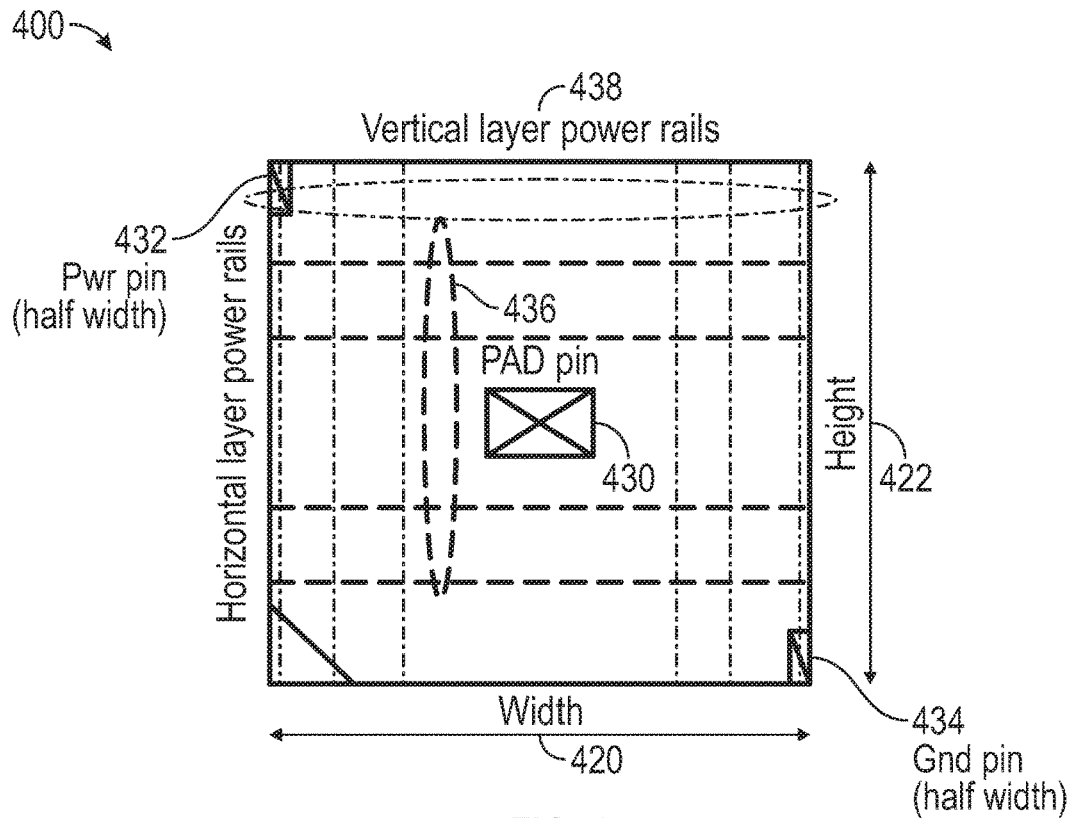
FIG. 4 illustrates an I/O cell with an aspect ratio according to an embodiment of the present invention.

FIG. 4 illustrates an I/O cell 400 with an aspect ratio according to an embodiment of the present invention. The I/O cell 400 has a width dimension 420 and a height dimension 422. The I/O cell 400 has a power pin region 432 and a ground pin region 434. Horizontal layer power rails 436 and vertical layer power rails 438 are also shown.

The I/O cell 400 shows that the width dimension 420 is approximately equal in magnitude to the height dimension 422. This aspect ratio of approximately 1:1 demonstrates that the shape of the I/O cell 400 is substantially square.

Conventional I/O cells typically have a height of approximately 100 micrometers and a width of approximately 25 micrometers. Thus, conventional I/O cells typically have a height dimension that is 4× the width dimension. This 4:1 (height to width) aspect ratio results in the conventional I/O cell being substantially rectangular.

The disclosure describes an I/O cell 400 that is substantially square. Typical dimensions for I/O cell 400, as disclosed herein, are a height of approximately 50 micrometers and a width of approximately 50 micrometers. Stated another way, the described I/O cell 400 has a height dimension 422 that is approximately one-half a height dimension of a conventional I/O cell and a width dimension 420 that is approximately two-times a width dimension of a conventional I/O cell.

The I/O cell 400 shows that the power pin 432 and ground pin 434 are dimensioned to have a region that is approximately one-half a corresponding region of a conventional I/O cell.

Thus, the power pin width 432 is approximately one-half a designated power pin width and the ground pin width 434 is approximately one-half a designated power ground pin width. A conventional power pin width is typically approximately 10 square micrometers in width. The power pin width 432 of I/O cell 400 is approximately 5 square micrometers in area.

A conventional ground pin width is typically approximately 10 square micrometers in width. The ground pin width 434 of I/O cell 400 is approximately 5 square micrometers in area.

Utilizing the disclosed design for the I/O cell 400 means that in flip chip designs, the I/O pad cell placement is no longer restricted to the periphery of the chip edge since the substantially square shaped I/O cell has substantially equal height and width dimensions. Indeed, flip chip I/O pad cells can be placed anywhere in the chip including the core area. In many instances, it is recommended to place the flip chip I/O pad cell close to a bump that the I/O cell connects to, so that the RDL (redistribution layer) routing length is minimized. The bump pitch limits the number of IO cells that can go between two bumps.

The disclosed I/O cell is compatible with either wirebond or flip chip packages.

The disclosed I/O cell 400 results in a change in the power bus structure and aspect ratio to have a wide (fat) and less tall (short) I/O pad cell, preferably a square size but not necessarily exactly square. Indeed, merely increasing the width dimension and decreasing the height dimension will result in performance enhancement and preferable characteristics.

The power and ground rails (PG) 436 (horizontal) and 438 (vertical) of I/O cell 400 are disposed so one layer 436 is arranged for horizontal PG rails that continues power in I/O ring when horizontally stacked the I/O cells and another layer 438 is arranged as vertical PG rails that continues power in I/O ring when vertically stacked the I/O cells. This design obviates a separate version of I/O pad cell (IO CELL HORIZONTAL) and facilitates re-using the same I/O pad cell on all sides of the chip edge.

A square sized PAD pin 430 is provided at the middle of the cell 400 and PG pins 432, 434 are provided at one of the opposite corners of the I/O cell 400. Each PG pin 432, 434 having approximately half the pin width of a conventional PG pin. When the next immediate I/O cell is flipped along the direction of the I/O ring stacking and abutted, the same PG pin (432, 434) gets shared and forms a full width PG pin. The PAD pin 430 and PG pins 432, 434 can be accessed from any direction using an RDL layer that is reserved for a connection, such as a bump, to I/O connections at SOC (system on chip).

When PG pins within the I/O pad cells are connected with RDL layer, it improves the SSO (simultaneous switch output) and ESD (electro static discharge) robustness. The number of PG pins in RDL layer are optimized using flip and abut method in the chip to reduce the RDL routing congestion at system on chip (SOC).

Figure 5:
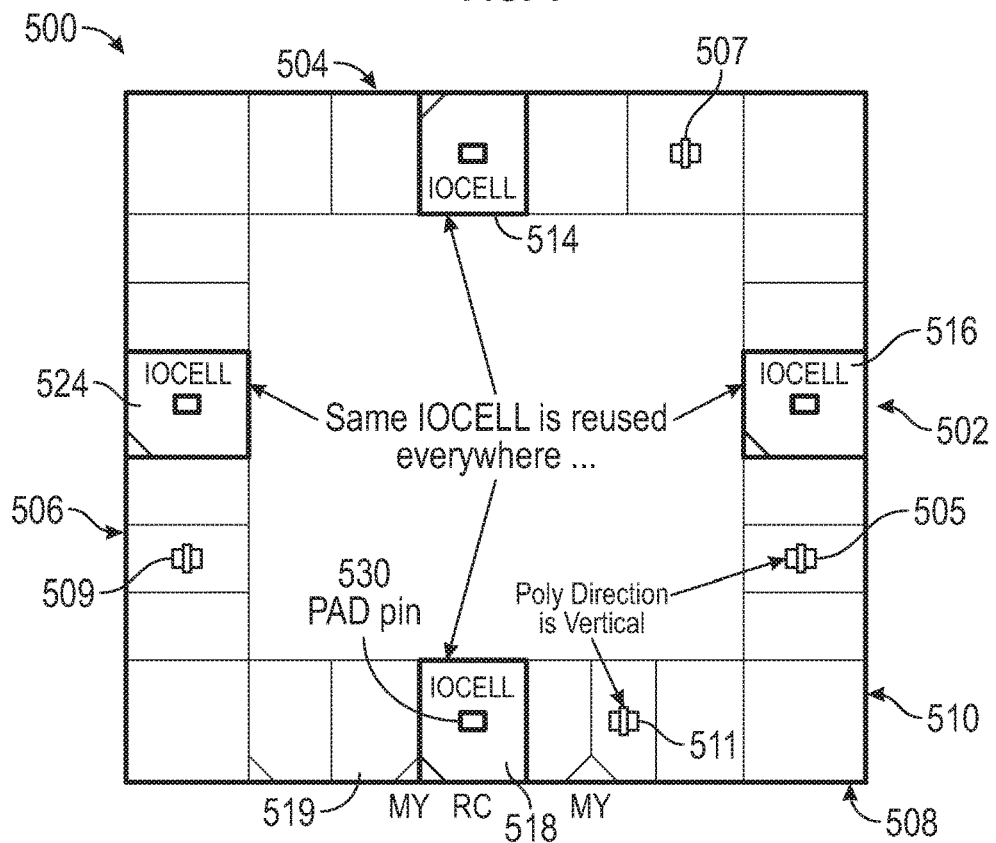
FIG. 5 shows an embodiment that uses a single I/O cell type in an I/O ring.

FIG. 5 shows an embodiment 500 that uses a single I/O cell type. The I/O pad ring 502, which may be mounted on a chip is formed of a single I/O cell layout design. As shown in FIG. 5, the I/O ring 502 uses I/O cells 514, 524, 518 and 516 each having a vertical layout.

The I/O ring 502, which may include a chip, which has four edges 504 (top), 506 (left-side), 508 (bottom) and 510 (right-side). Any orientation of the chip and/or I/O ring 502 is an embodiment of this disclosure. I/O cells 514, 524, 518 and 516 are mounted on sides 504, 506, 508 and 510, respectively. I/O cells 505, 507, 509, 519 and 511 are also shown. I/O cell 519 is adjacent to I/O cell 518. Thus, I/O cell 519 can be flipped about its Y-axis to abut I/O cell 518.

Each of the I/O cells 505, 507, 509, 511, 514, 516, 518, 519 and 524 are vertical. Thus, the I/O ring 502 is comprised of a single type of cells (i.e., vertical I/O cells). I/O cell 518 has PAD pin 530.

Figure 6:
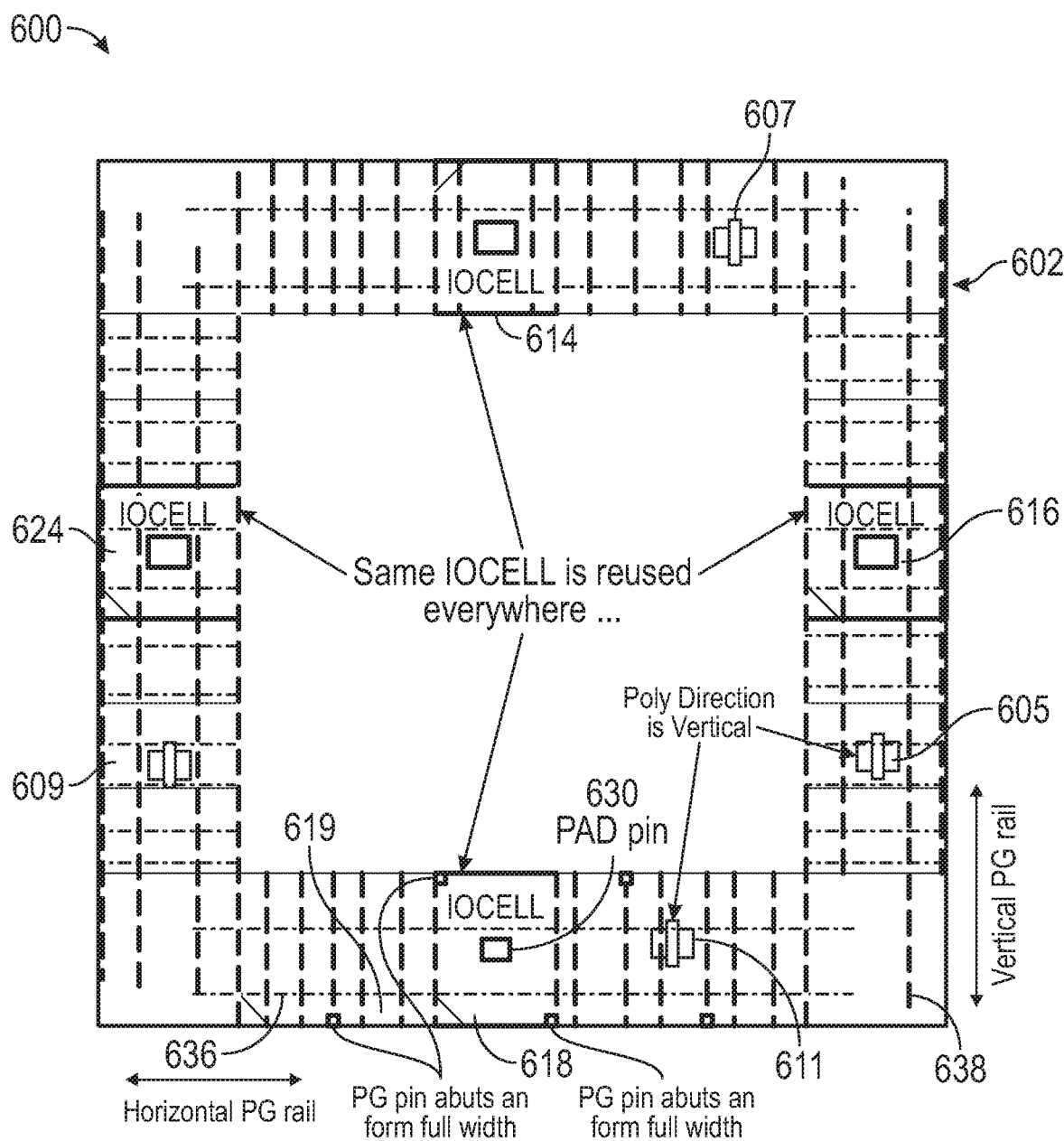
FIG. 6 shows an embodiment of a single I/O cell type having power and ground rail continuity in an I/O ring.

FIG. 6 shows an embodiment 600 of a single I/O cell type having power and ground rail continuity. As shown in FIG. 6, the I/O ring 602 has vertical I/O cells 605, 607, 609, 611, 616, 614, 618, 619 and 624. Horizontal PG rail 636 and vertical PG rail 638 are also shown. The horizontal PG rail 636 and vertical PG rail 638 illustrates that power continuity through the I/O ring 602 is achieved using I/O cells of a single layout design.

Figure 7:
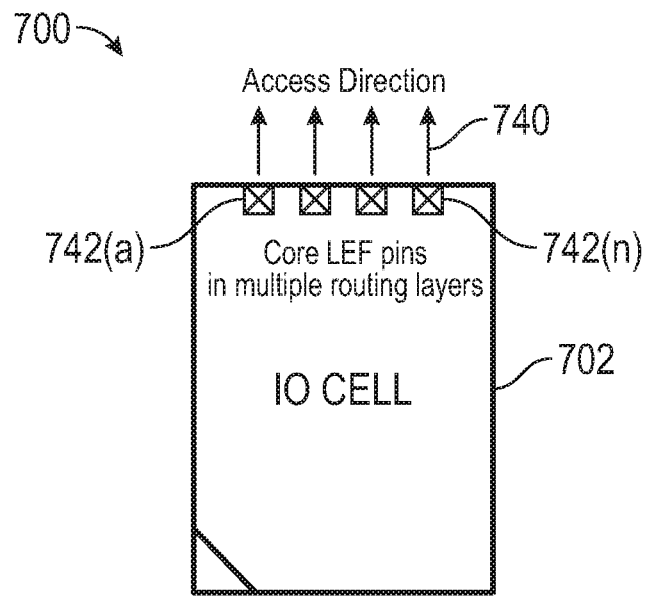
FIG. 7 shows an embodiment of LEF (library exchange format) pins in an I/O cell.

FIG. 7 shows an embodiment 700 of LEF (library exchange format) pins in an I/O cell 702. The IO cell 702 features and functionalities are controlled through signal pins 742(a) . . . (n) (where "n" is any suitable number) that are driven by core circuitry. These pins, generally 742 are provided at the I/O cell edge that is facing the core side and have a single access direction 740.

Figure 8:
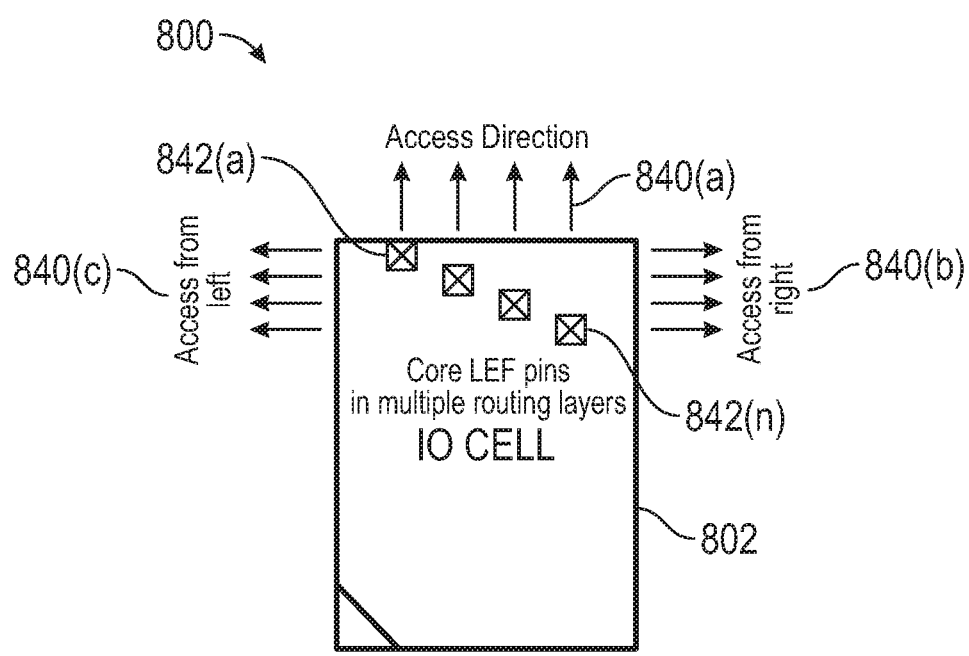
FIG. 8 shows an embodiment of incrementally staggered placement of LEF pins in an I/O cell.

FIG. 8 shows an embodiment 800 of staggered LEF pins in an I/O cell. The IO cell 802 features and functionalities are controlled through signal pins 842(a) . . . (n) (where "n" is any suitable number) that are driven by core circuitry. These pins, generally 842 are provided at the I/O cell edge so that access to the pins 842 is achieved from three directions.

FIG. 8 shows that existing core LEF pins placement is modified to incremental staggered placement so that these pins can be accessed from both vertical and horizontal directions. Associate routing channels are provided in the I/O cell to access these core LEF pins for a dual row I/O design.

Figure 9:
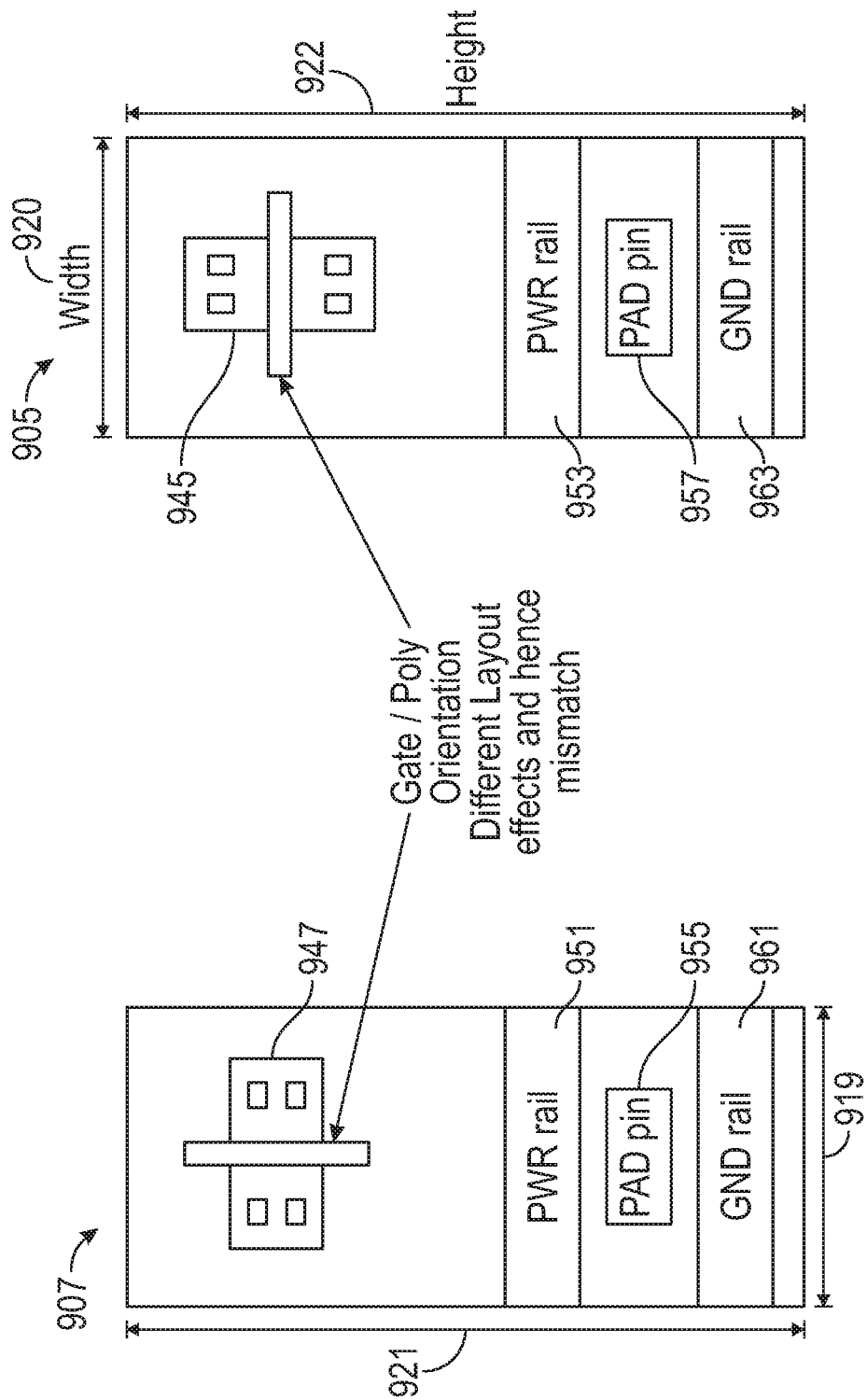
FIGS. 9A and 9B show an I/O cell with a vertical poly orientation and an I/O cell with a horizontal poly orientation, respectively.

FIGS. 9A and 9B show a vertical I/O cell 907 and horizontal I/O cell 905, respectively. FIG. 9A shows that the vertical I/O cell 907 has vertical component 947, power rail 951, ground rail 961 and PAD pin 955. The I/O cell 907 has width dimension 919 and height dimension 921.

FIG. 9B shows that the horizontal I/O cell 905 has horizontal component 945, power rail 953, ground rail 963 and PAD pin 957. The I/O cell 905 has width dimension 920 and height dimension 922.

Figure 10:
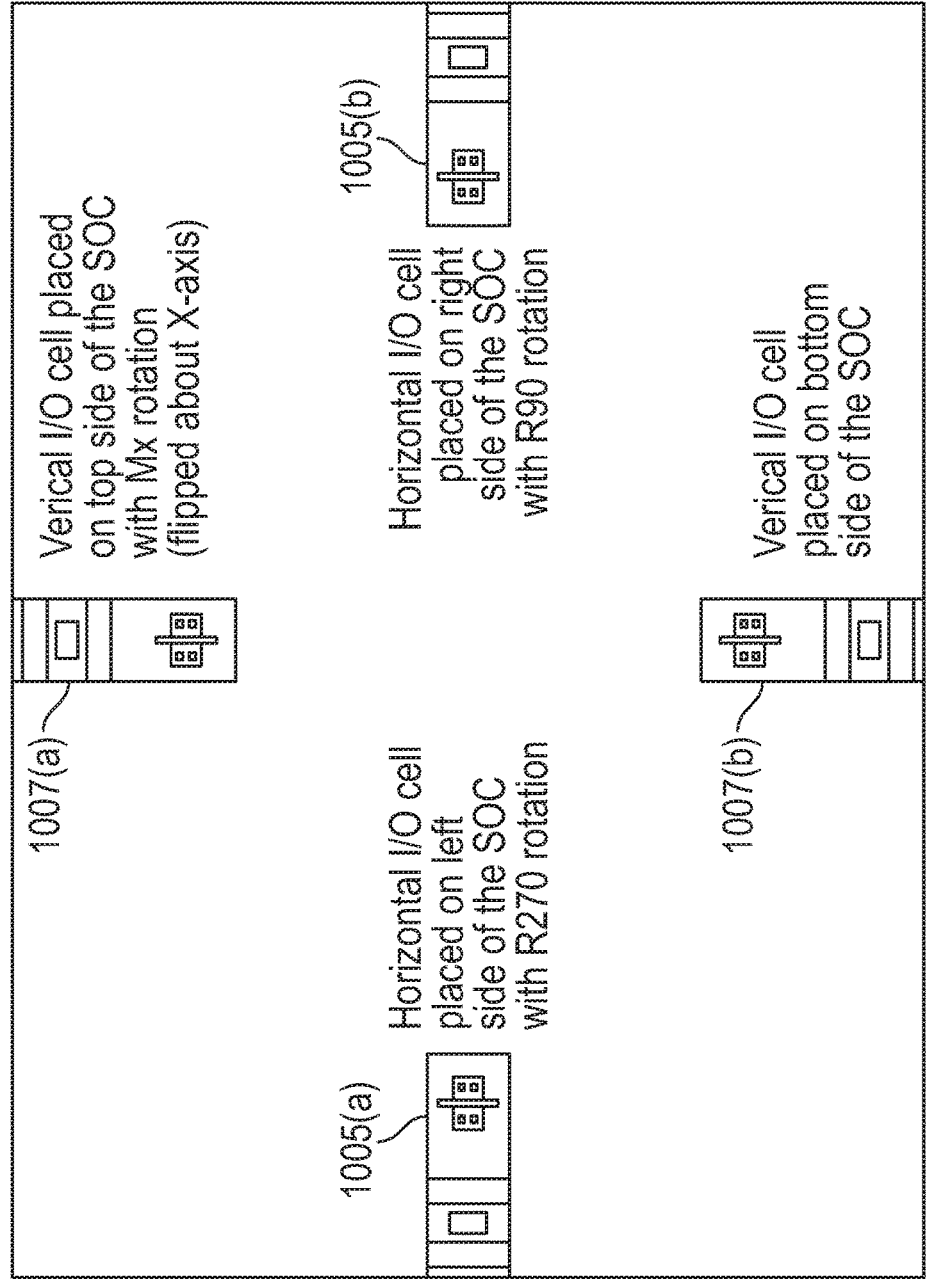
FIG. 10 shows placement of I/O cell with a vertical poly direction and an I/O cell with a horizontal poly direction, in SOC (silicon on chip) resulting in a single poly orientation across the SOC.

FIG. 10 shows placement of I/O cell in SoC (system on chip) in a vertical poly orientation across the system on chip (SOC). As shown in FIG. 10, system 1000 includes horizontal I/O cells 1005(a) and 1005(b) placed on the left and right sides of the SOC, respectively. I/O cell 1005(a) has a 90-degree rotation and I/O cell 1005(b) has a 270-degree rotation.

System 1000 also includes vertical I/O cells 1007(a) and 1007(b) placed on the top and bottom sides of the SoC, respectively. I/O cell 1007(a) has been flipped about its X-axis.

Figure 11:
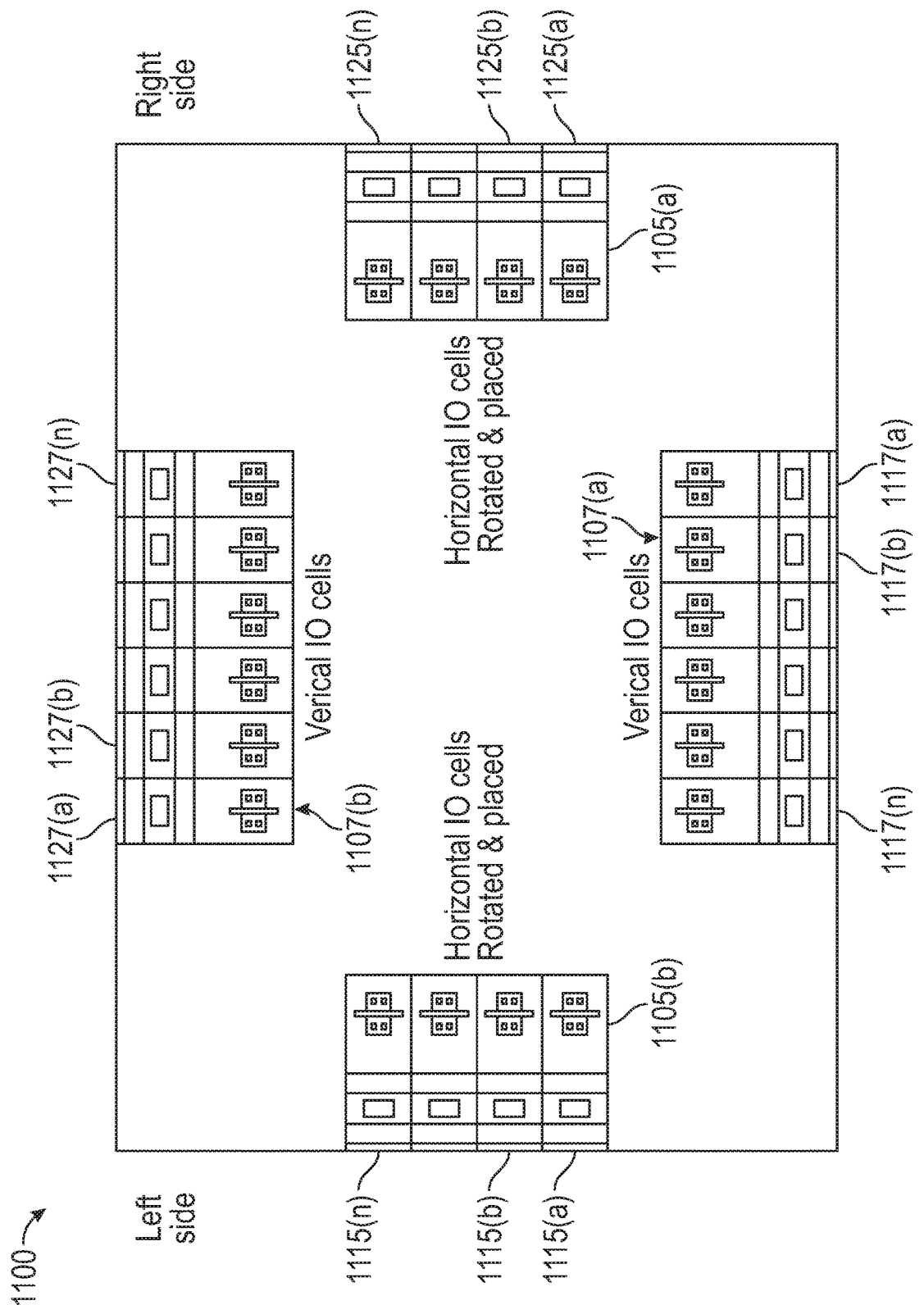
FIG. 11 shows a plurality of I/O cell placement in SOC (silicon on chip) resulting in a single poly orientation across the SOC.

FIG. 11 shows an SoC system 1100 that includes a plurality of I/O cells in a vertical poly orientation across the SoC system 1100. System 1100 includes horizontal I/O cells 1105(a) placed on the right side of the SoC and horizontal I/O cells 1105(b) placed on the left side of the SoC. I/O cells 1105(a) include horizontal I/O cells 1125(a) . . . (n) (where "n" is any suitable number. I/O cells 1105(b) include horizontal I/O cells 1115(a) . . . (n) (where "n" is any suitable number). The horizontal I/O cells 1115 and 1125 are rotated and then placed on the associated edge of the SoC.

SoC system 1100 also includes vertical I/O cells 1107(a) placed on the bottom side of the SoC and vertical I/O cells 1107(b) placed on the top side of the SoC. I/O cell 1107(a) includes vertical I/O cells 1117(a) . . . (n) (where "n" is any suitable number. I/O cell 1107(b) includes vertical I/O cells 1127(a) . . . (n) (where "n" is any suitable number).

Figure 12:
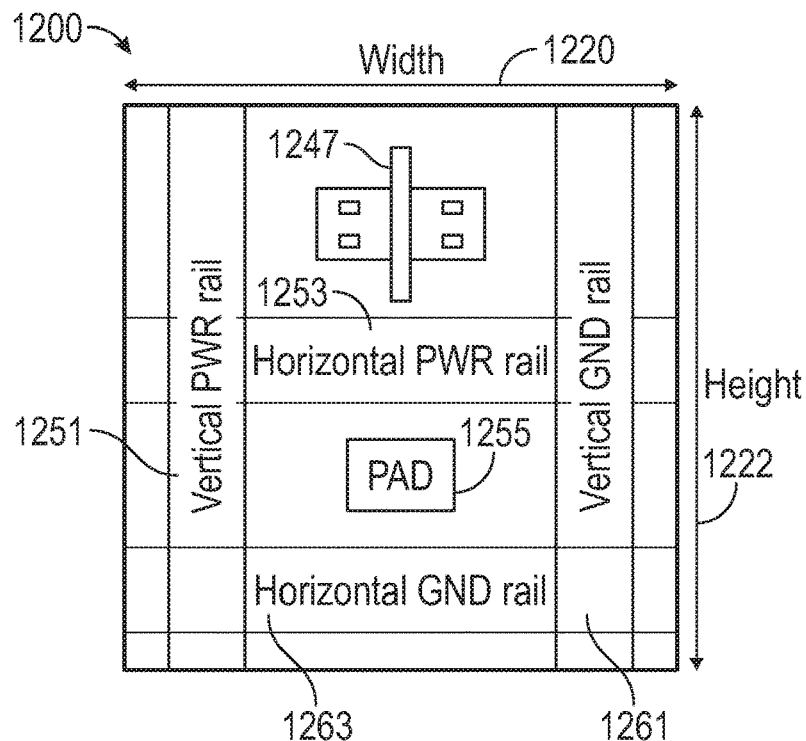
FIG. 12 shows an I/O pad cell layout design with a substantially square-shaped I/O cell.

FIG. 12 shows an I/O pad cell layout design 1200 with a substantially square-shaped I/O cell. The design 1200 includes width dimension 1220 that is approximately 50 micrometers and height dimension that is approximately 50 micrometers. Vertical I/O element 1247, PAD 1255, horizontal power rail 1253, horizontal ground rail 1263, vertical power rail 1251 and vertical ground rail 1261 are also shown. The I/O cell is wider and shorter than a conventional cell and supports multi-row I/O ring.

Figure 13:
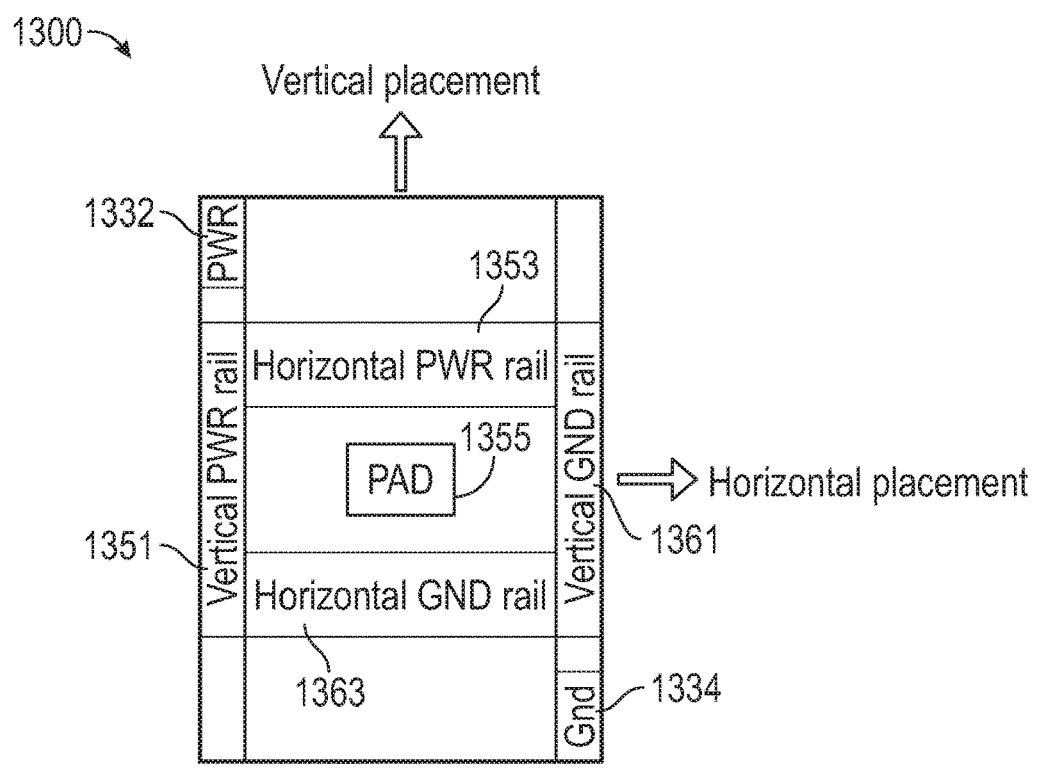
FIG. 13 shows another embodiment of an I/O cell design with a substantially square-shaped I/O cell.

FIG. 13 shows another embodiment of an I/O cell design 1300 with a substantially square-shaped I/O cell. The I/O cell 1300 has a power pin dimension 1332 and a ground pin dimension 1334. The power pin dimension 1332 and ground pin dimension 1334 are each approximately one-half the dimension of a typical pin dimension. PAD 1355, horizontal power rail 1353, horizontal ground rail 1363, vertical power rail 1351 and vertical ground rail 1361 are also shown. The I/O cell 1300 has relatively increased width with reduced height and a vertical power bus in addition to horizontal power bus and provided RDL pins (shared) for power and ground within the I/O cell. The design 1300 is a single cell in SoC with an increased ESD (electro static discharge) robustness and SSO (simultaneous switching noise).

Figure 14:
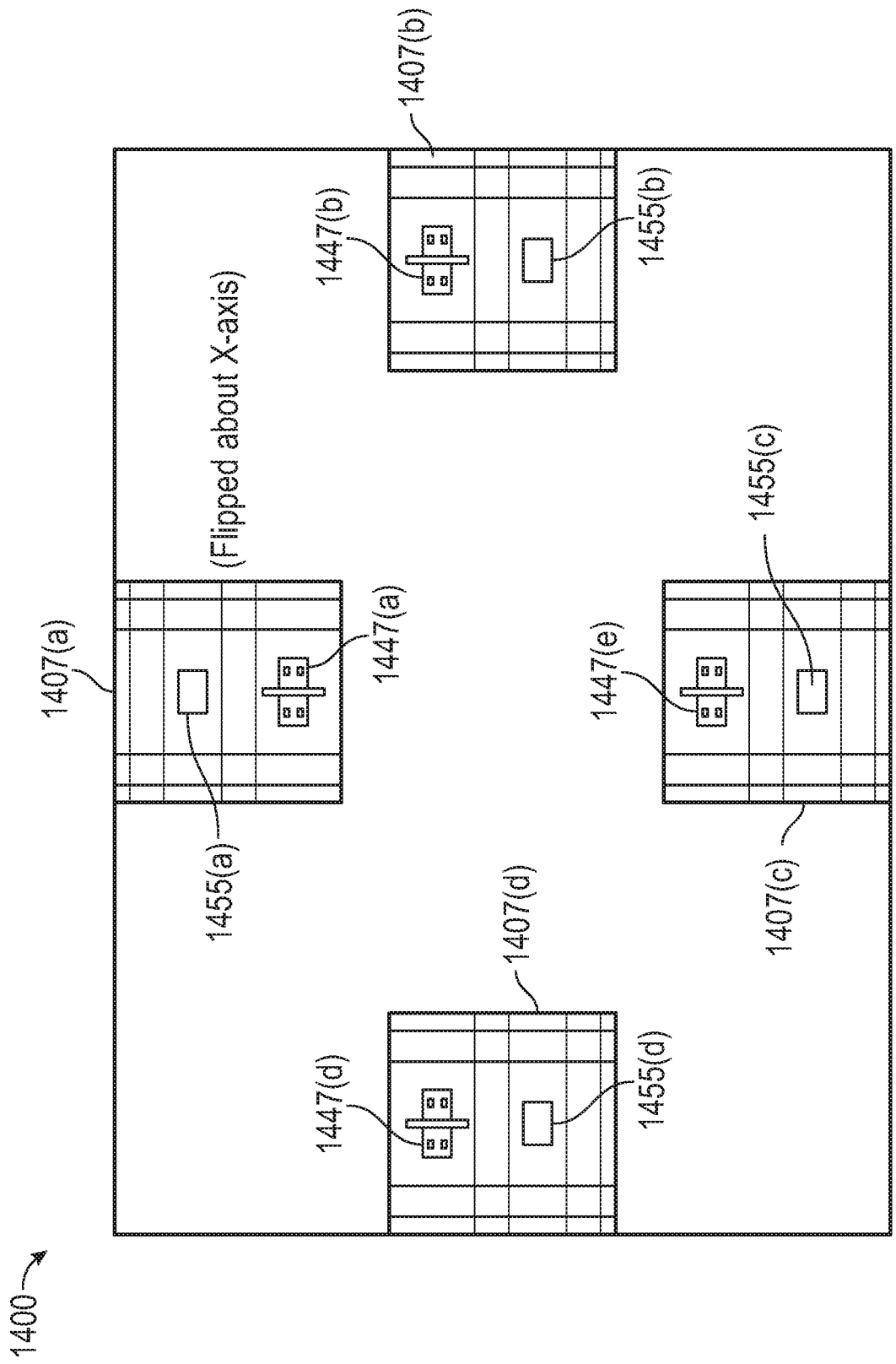
FIG. 14 shows an embodiment that re-uses a single I/O cell of a single design on every side of SOC, resulting in a single ploy orientation across the SOC.

FIG. 14 shows an embodiment 1400 that re-uses a single I/O cell of a single layout design on every side of SOC in a vertical ploy orientation across the SoC. As shown in FIG. 14, vertical I/O cells 1407(*a*), (*b*), (*c*) and (*d*) are disposed on a top side, right side, bottom side and left side, respectively. Each vertical I/O cell, generally, 1407 has an associated vertical element, generally, 1447 and a PAD portion, generally, 1455. Thus, the I/O cell is re-used on every side of the SoC and has vertical poly orientation across the SoC. The I/O cell 1407(*a*) is flipped about its X-axis.

Figure 15:
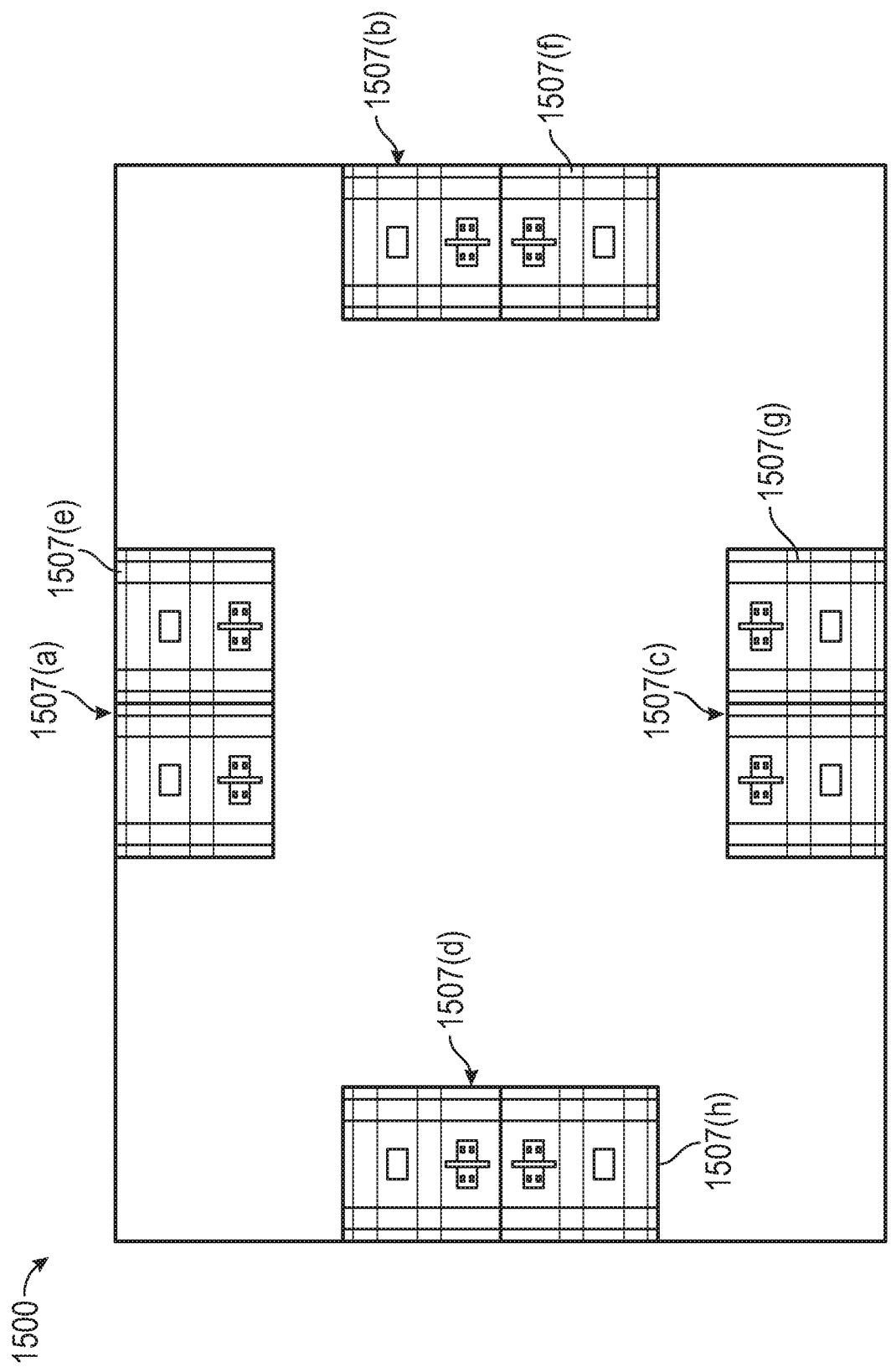
FIG. 15 shows an embodiment that re-uses I/O cells of a single design on every side of SOC, resulting in a single ploy orientation across the SOC.

FIG. 15 shows an embodiment 1500 that re-uses I/O cells of a single layout design on every side of SoC in a vertical ploy orientation across the SoC. As shown in FIG. 15, vertical I/O cells 1507(*a*), (*b*), (*c*) and (*d*) are disposed on a top side, right side, bottom side and left side, respectively. Also shown are I/O cell 1507(*e*), (*f*), (*g*) and (*h*).

The I/O cell 1507(*a*) is stacked, or abuts, I/O cell 1507(*e*). The I/O cell 1507(*b*) is stacked, or abuts, I/O cell 1507(*f*). The I/O cell 1507(*c*) is stacked, or abuts, I/O cell 1507(*g*). The I/O cell 1507(*d*) is stacked, or abuts, I/O cell 1507(*h*).

Thus, the I/O cell, generally 1507, is re-used on every side of the SoC and has vertical poly orientation across the SoC.

Figure 16:
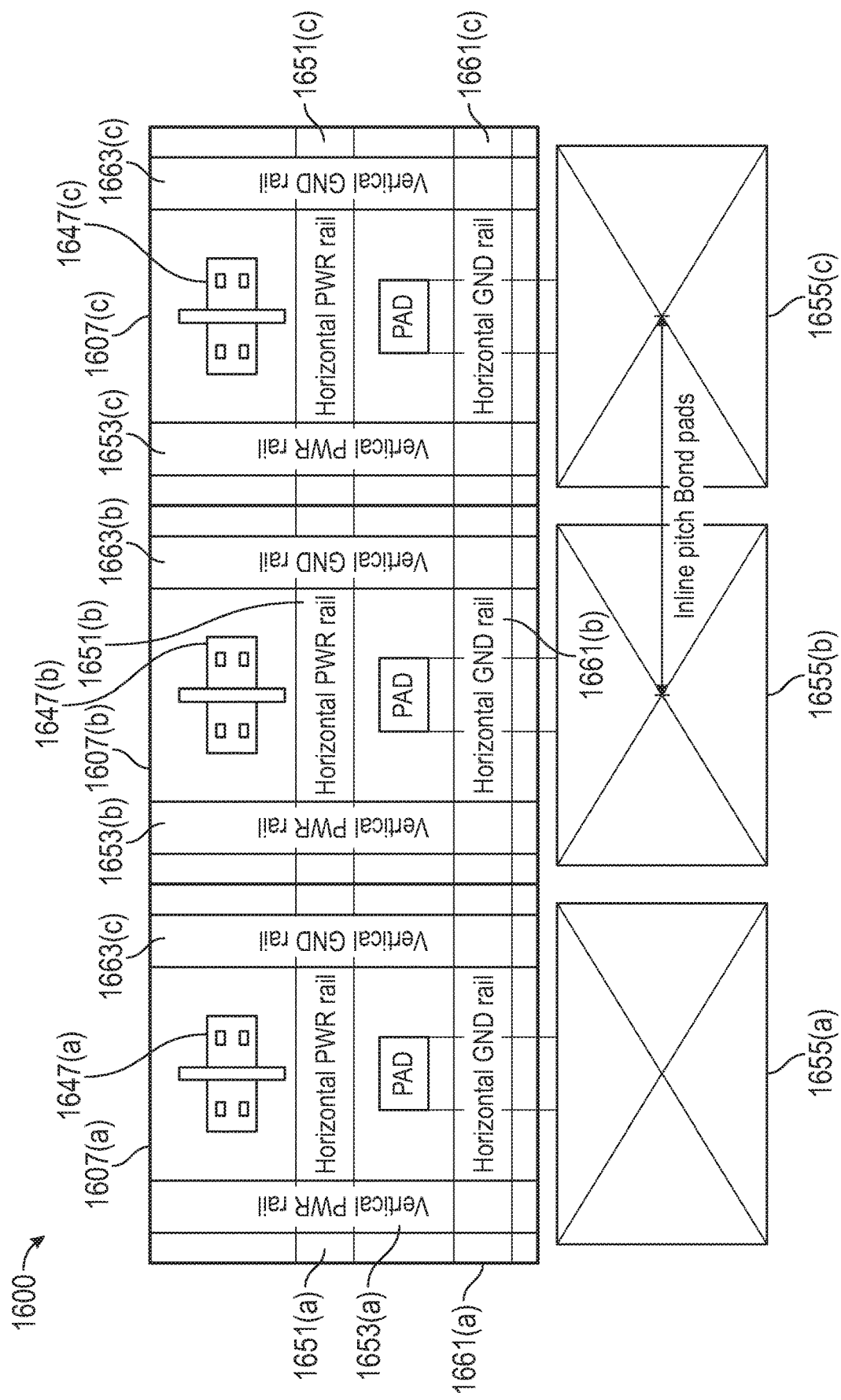
FIG. 16 shows an embodiment of an in-line bond pad.

FIG. 16 shows an embodiment 1600 of an in-line bond pad. As shown in FIG. 16, I/O cells 1607(*a*), 1607(*b*) and 1607(*c*) abut one another. Each I/O cell, generally 1607, has an associated vertical element 1647, horizontal power rail 1651, vertical power rail 1653, horizontal ground rail 1661, vertical ground rail 1663 and Bond PAD region 1655. The Bond PAD regions 1655 are inline pitch bond pads. The alignment of I/O cells 1607 shows that the horizontal ground rails and horizontal power rails are aligned. The vertical power rail and vertical ground rails are also aligned.

Figures 17A, 17B:
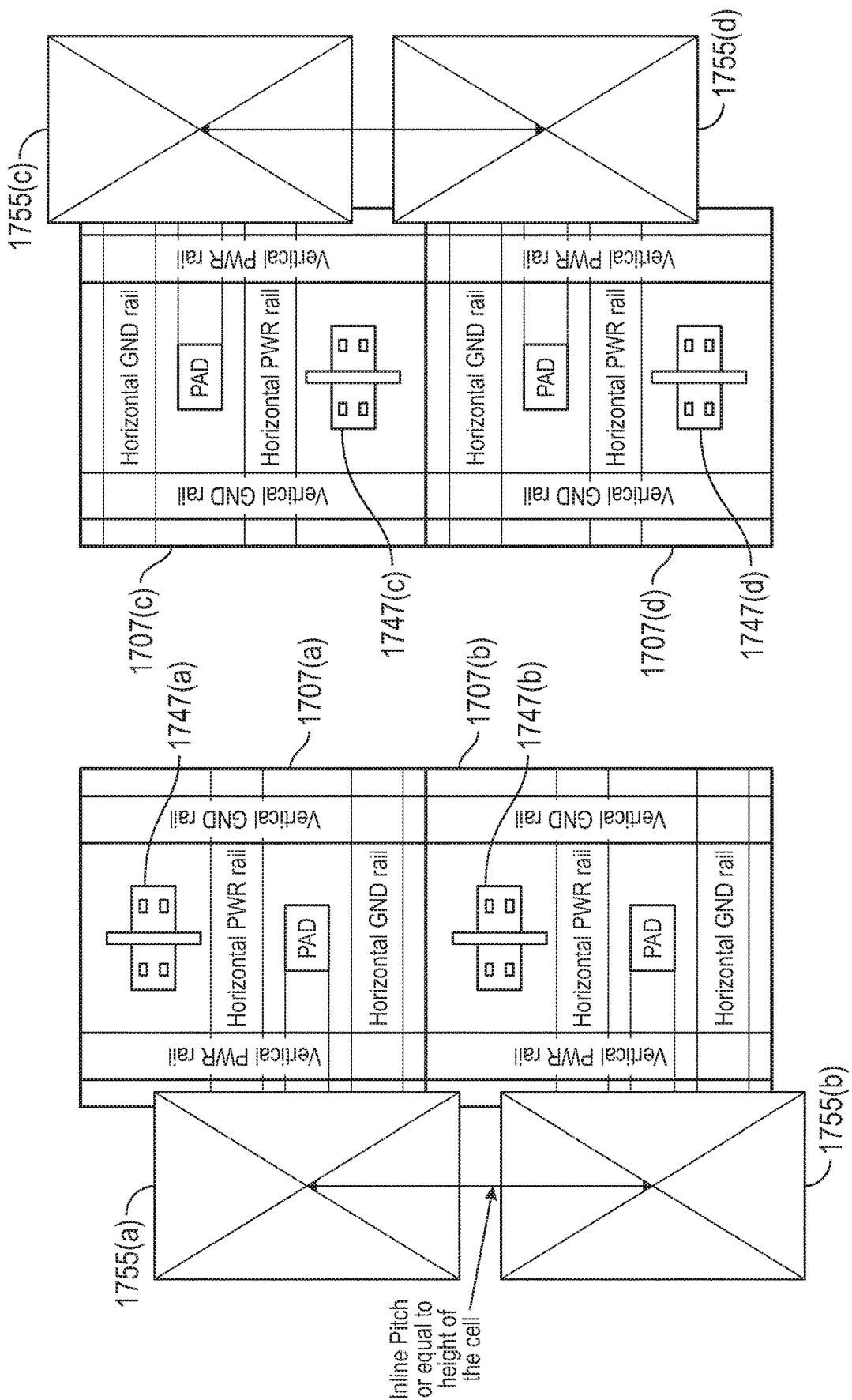
FIGS. 17A and 17B show an embodiment of in-line bond pad right-side and left-side of SOC, respectively.

FIGS. 17A and 17B show an embodiment of in-line bond pad left-side and right-side of the SOC, respectively. As shown in FIG. 17A, vertical I/O cells 1707(*a*) and 1707(*b*) abut each other about their X-axis. Elements 1747(*a*) and 1747(*b*), associated with corresponding I/O cell 1707(*a*) and 1707(*b*), respectively, illustrate that the I/O cell is vertical. PADs 1755(*a*) and 1755(*b*) are inline pitch or equal to the height of the cell.

FIG. 17B shows vertical I/O cells 1707(*c*) and 1707(*d*) abut each other about their X-axis. Elements 1747(*c*) and 1747(*d*), associated with corresponding I/O cell 1707(*c*) and 1707(*d*), respectively, illustrate that the I/O cell is vertical. Bond PADs 1755(*c*) and 1755(*d*) are also shown.

Figure 18:
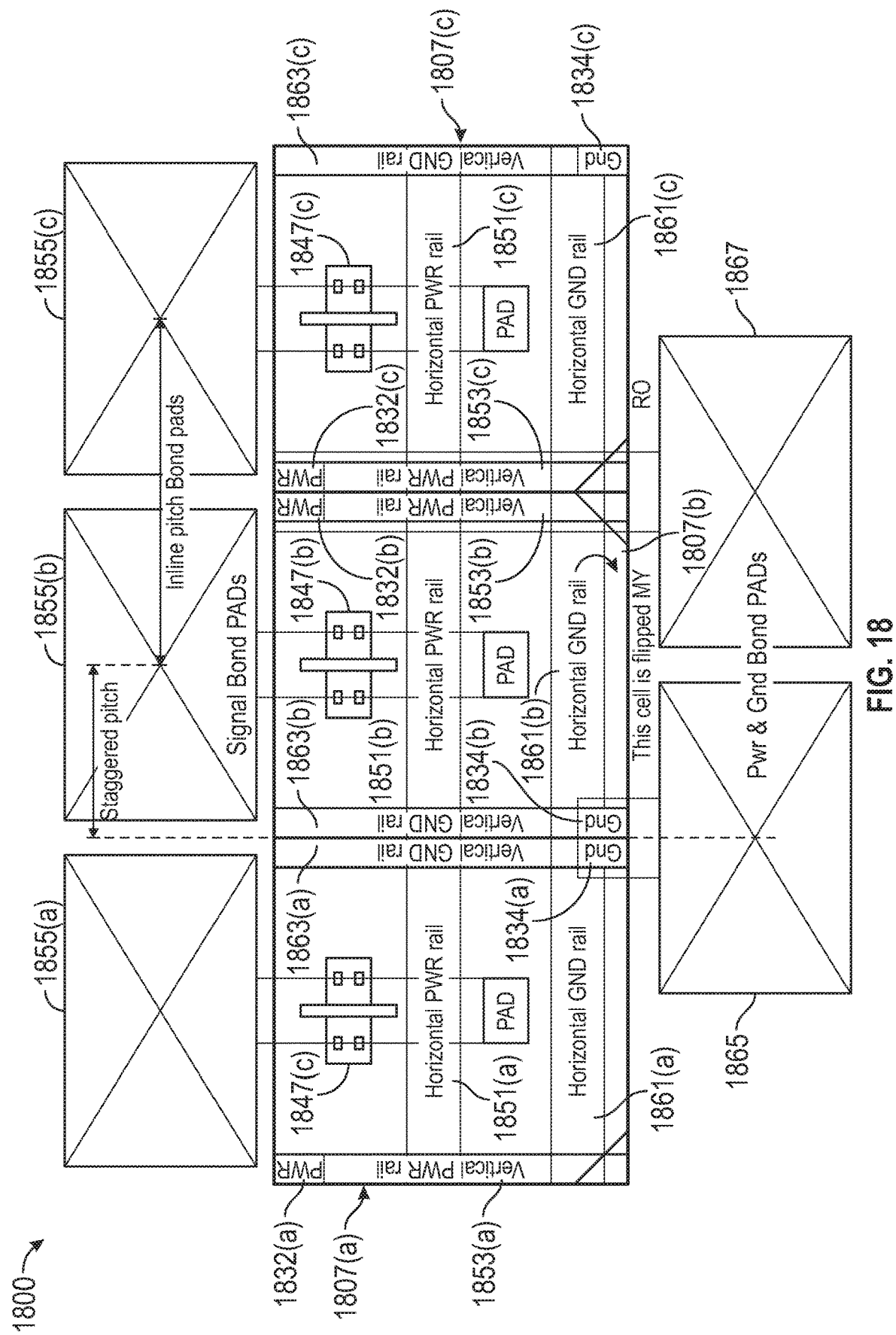
FIG. 18 shows an embodiment in which the alternate I/O cell is flipped about its Y-axis.

FIG. 18 shows an embodiment 1800 in which the alternate I/O cell is flipped about its Y-axis. I/O cell 1807(*b*) is flipped about its Y-axis so that the I/O cell 1807(*b*) is stacked against I/O cell 1807(*a*) and I/O cell 1807(*c*).

As shown in FIG. 18, I/O cells 1807(*a*), 1807(*b*) and 1807(*c*) abut one another. Each I/O cell, generally 1807, has an associated vertical element 1847, horizontal power rail 1851, vertical power rail 1853, horizontal ground rail 1861, vertical ground rail 1863 and signal bond PAD region 1855(*a*), (*b*) and (*c*) associated with a corresponding I/O cell 1807(*a*), (*b*) and (*c*), respectively. Power bond pad 1865 and ground pad 1867 are also shown.

After flipping I/O cell 1807(*b*) about its Y-axis, the alignment of I/O cells 1807 shows that the horizontal ground rails and horizontal power rails are aligned. The vertical power rail and vertical ground rails are also aligned. The power pin region 1832 and ground pin region 1834 are approximately half the size of a convention power pin region/ground pin region. After I/O cell 1807(*b*) is flipped about its Y-axis the I/O cell 1807(*b*) is stacked against I/O cell 1807(*a*) and I/O cell 1807(*c*). This flipping of I/O cell 1807(*b*) aligns the ground pin 1834(*b*) of I/O cell 1807(*b*) with ground pin 1834(*a*) of I/O cell 1807(*a*). The flipping of I/O cell 1807(*b*) also aligns the power pin 1832(*b*) of I/O cell 1807(*b*) with power pin 1832(*c*) of I/O cell 1807(*c*).

Figure 19:
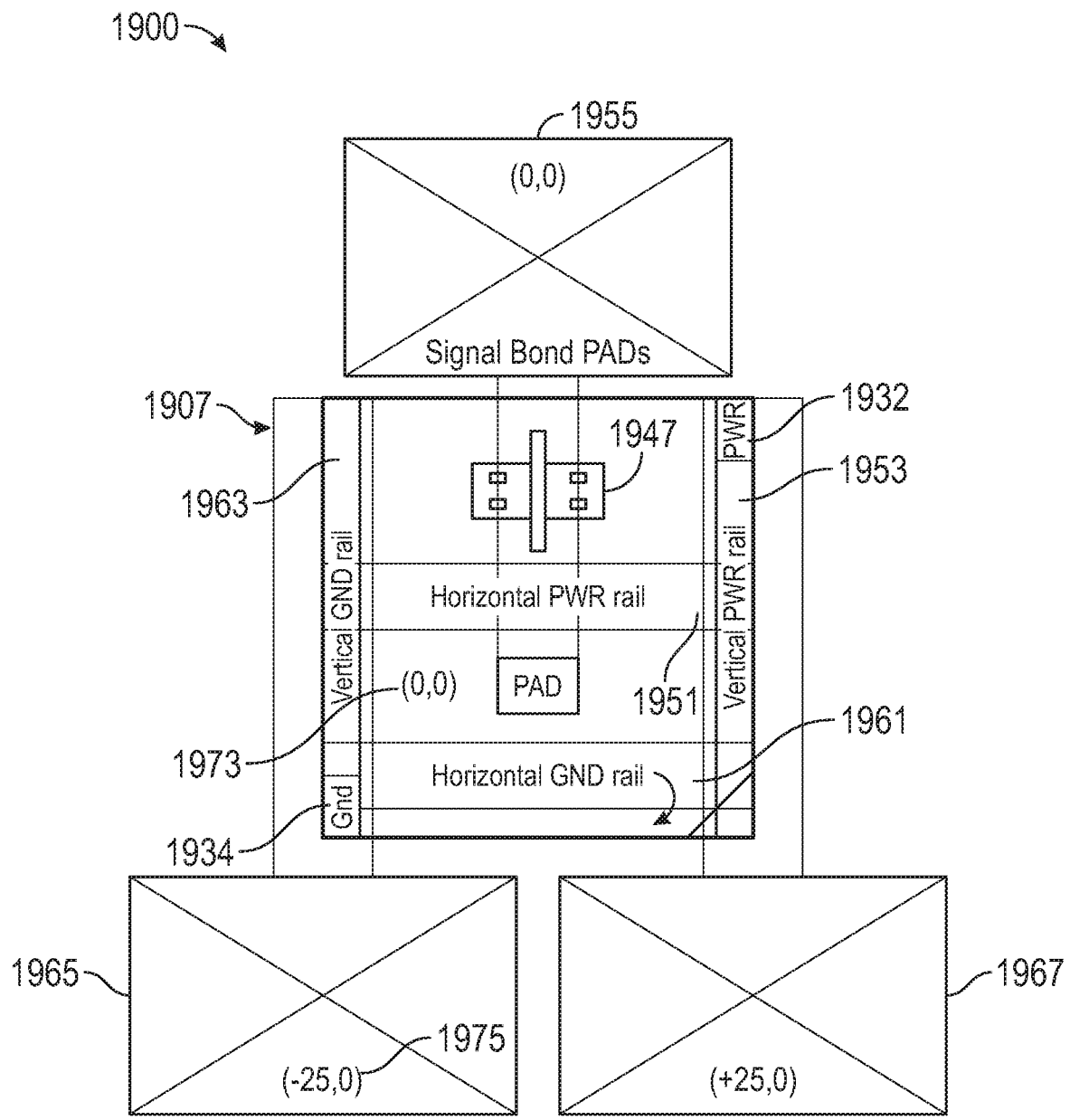
FIG. 19 shows placement co-ordinates of an I/O cell and bond pads.

FIG. 19 layout 1900 shows placement co-ordinates of an I/O cell and Bond PADS. As shown in FIG. 19, I/O cell 1907 has been flipped about its Y-axis so the components of the I/O cell 1907 are commensurate with the flipped version of the I/O cell. The I/O cell 1907 has a vertical element 1947, horizontal power rail 1951, vertical power rail 1953, horizontal ground rail 1961, vertical ground rail 1963 and signal bond PAD regions 1955, 1965, and 1967. Power pin 1932 and ground pin 1934 are also shown. The signal bond pad 1955 has coordinates (0,0) while bond pads 1965 and 1967 have relative coordinates (−25(half of the I/O cell width),0) and (+25(half of the I/O cell width),0), respectively.

Figure 20:
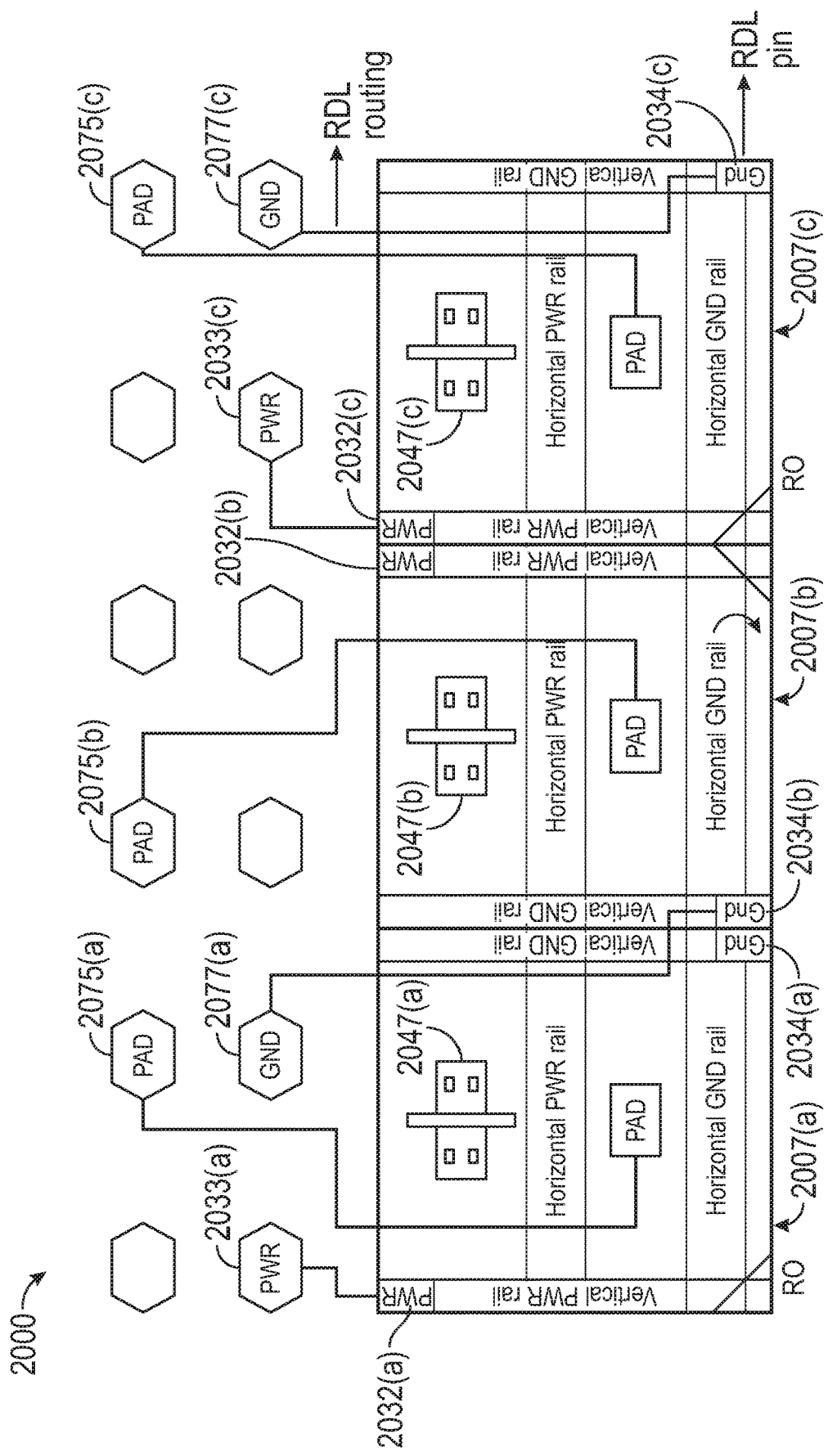
FIG. 20 shows an embodiment of a flip-chip bottom side implementation.

FIG. 20 shows an embodiment 2000 of a flip-chip bottom side implementation. As shown in FIG. 20, I/O cells 2007(*a*), 2007(*b*) and 2007(*c*) form a portion of an I/O ring. I/O cell 2007(*a*) is a first I/O cell. I/O cell 2007(*b*) is a second cell (alternate I/O cell). I/O cell 2007(*c*) is a third cell. I/O cell 2007(*b*) has been flipped about its Y-axis. The second cell I/O cell 2007(*b*) abuts first I/O cell 2007(*a*). Third I/O cell 2007(*c*) abuts second I/O cell 2007(*b*). Each I/O cell, generally 2007, has an associated vertical element, generally 2047, power pin region, generally 2032, and ground pin region, generally 2034.

Power bump 2033(*a*) is connected to the power pin region 2032(*a*) of I/O cell 2007(*a*). Signal bump 2075(*a*) is connected to pad of I/O cell 2007(*a*). Ground bump 2077(*a*) is coupled to ground pin 2034(*a*).

I/O cell 2007(*b*) is flipped about its Y-axis and abuts I/O cell 2007(*a*). The horizontal power rail of I/O cell 2007(*b*) aligns with the horizontal power rail of I/O cell 2007(*a*).

The horizontal ground rails of I/O cell 2007(*a*) and I/O cell 2007(*b*) also align.

The power pin region 2032(*c*) of I/O cell 2007(*c*) aligns with the power pin region 2032(*b*) of I/O cell 2007(*b*). The ground pin region 2034(*a*) of I/O cell 2007(*a*) aligns with the ground pin region 2034(*b*) of I/O cell 2007(*b*).

The I/O cell 2007(*c*) is not flipped, or maintains its orientation relative to I/O cell 2007(*a*). Power bump 2033(*c*) is connected to the power pin region 2032(*c*) of I/O cell 2007(*c*). Signal bump 2075(*c*) is connected to pad of I/O cell 2007(*c*). Ground bump 2077(*c*) is coupled to ground pin 2034(*c*).

I/O cell 2007(*c*) maintains its original orientation relative to 2007(*a*) and 2007(*b*), which has been flipped about its Y-axis and abuts I/O cell 2007(a) along its Y-axis. I/O cell 2007(a), 2007(b) and 2007(c) each have an associated vertical power rail, vertical ground rail horizontal power rail and horizontal ground rail, as previously described herein.

Figure 21:
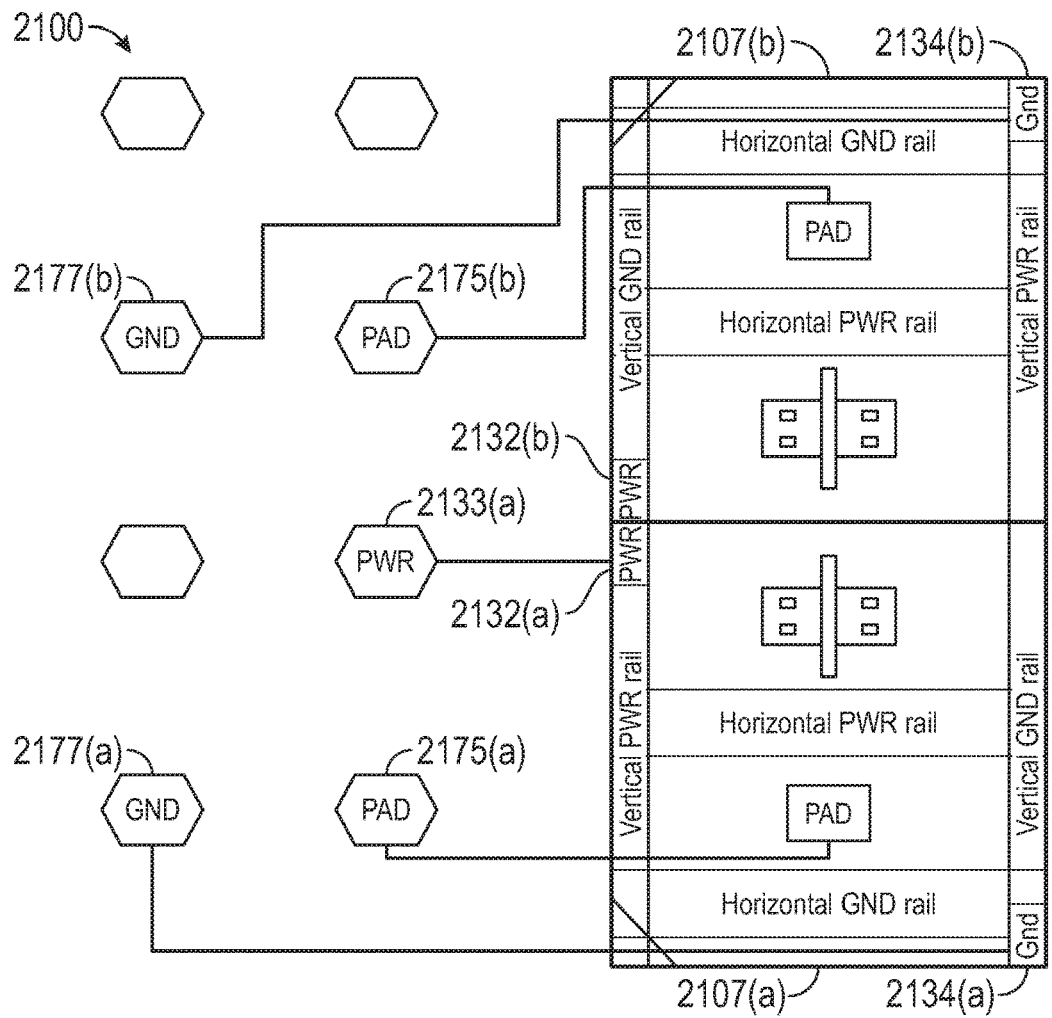
FIG. 21 shows an embodiment of a flip-chip right side implementation

FIG. 21 shows an embodiment of a flip-chip right side implementation 2100. As shown in FIG. 21, I/O cell 2107(a) and I/O cell 2107(b) are abutting along their respective X-axis. I/O cell 2107(b) has been flipped about its X-axis and abuts I/O cell 2107(a) along its X-axis. The vertical ground rail and vertical power rail of 2107(a) aligns with the vertical ground rail and vertical power rail of 2107(b).

The power pin region 2132(a) of I/O cell 2107(a) aligns with the power pin region 2132(b) of I/O cell 2107(b). The ground pin region 2134(a) of I/O cell 2107(a) aligns with the ground pin region 2134(b) of I/O cell 2107(b).

Power bump 2133(a) is connected to the power pin region 2132(a) of I/O cell 2107(a). Signal bump 2175(a) is connected to pad of I/O cell 2107(a). Ground bump 2177(a) is coupled to ground pin 2134(a).

Signal bump 2175(b) is connected to pad of I/O cell 2107(b). Ground bump 2177(b) is coupled to ground pin 2134(b).

Figure 22:
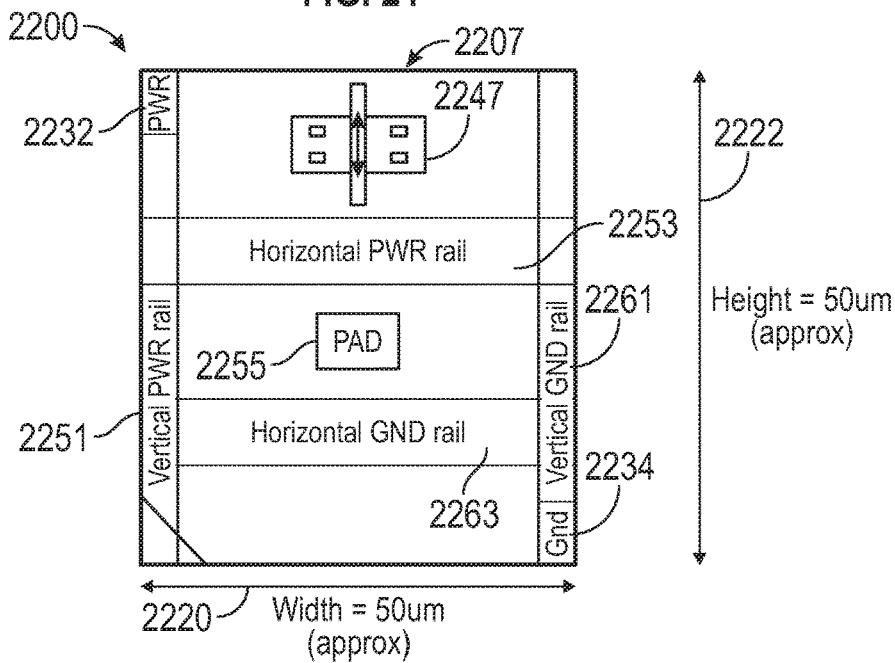
FIG. 22 shows an embodiment of an I/O cell having approximately equal height and width dimensions.

FIG. 22 shows an embodiment 2200 of an I/O cell having approximately equal height 2222 and width 2220 dimensions. The I/O cell 2200 has a power pin dimension 2232 and a ground pin dimension 2234. The power pin dimension 2232 and ground pin dimension 2234 are each approximately one-half the dimension of a typical pin dimension. PAD 2255, horizontal power rail 2253, horizontal ground rail 2263, vertical power rail 2251 and vertical ground rail 2261 are also shown.

Figure 23:
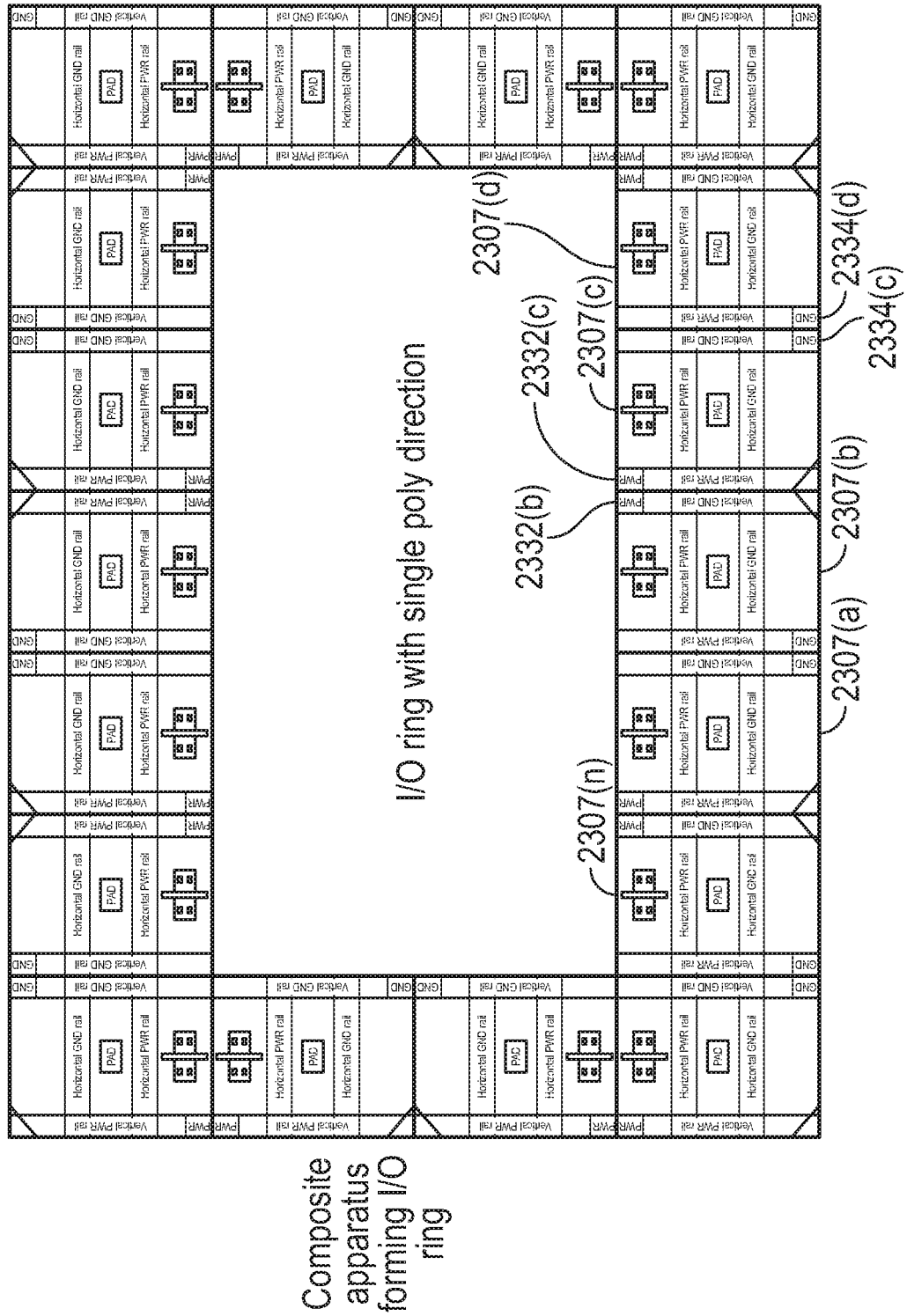
FIG. 23 shows an embodiment of a composite I/O ring having a single poly orientation across the SOC.

FIG. 23 shows an embodiment of a composite I/O ring 2300 having single poly direction, which is vertical. The composite I/O ring 2300 is two or more cells that abut one another. The I/O ring 2300 has a plurality of I/O cell 2307(a) . . . (n) (where "n" is any suitable number). The power pad region 2332(b) of I/O cell 2307(b) and power pad region 2332(c) of I/O cell 2307(c) are aligned. Ground pin region 2334(c) of I/O cell 2307(c) is aligned with ground pin region 2334(d) of I/O cell 2307(d).

Figure 24:
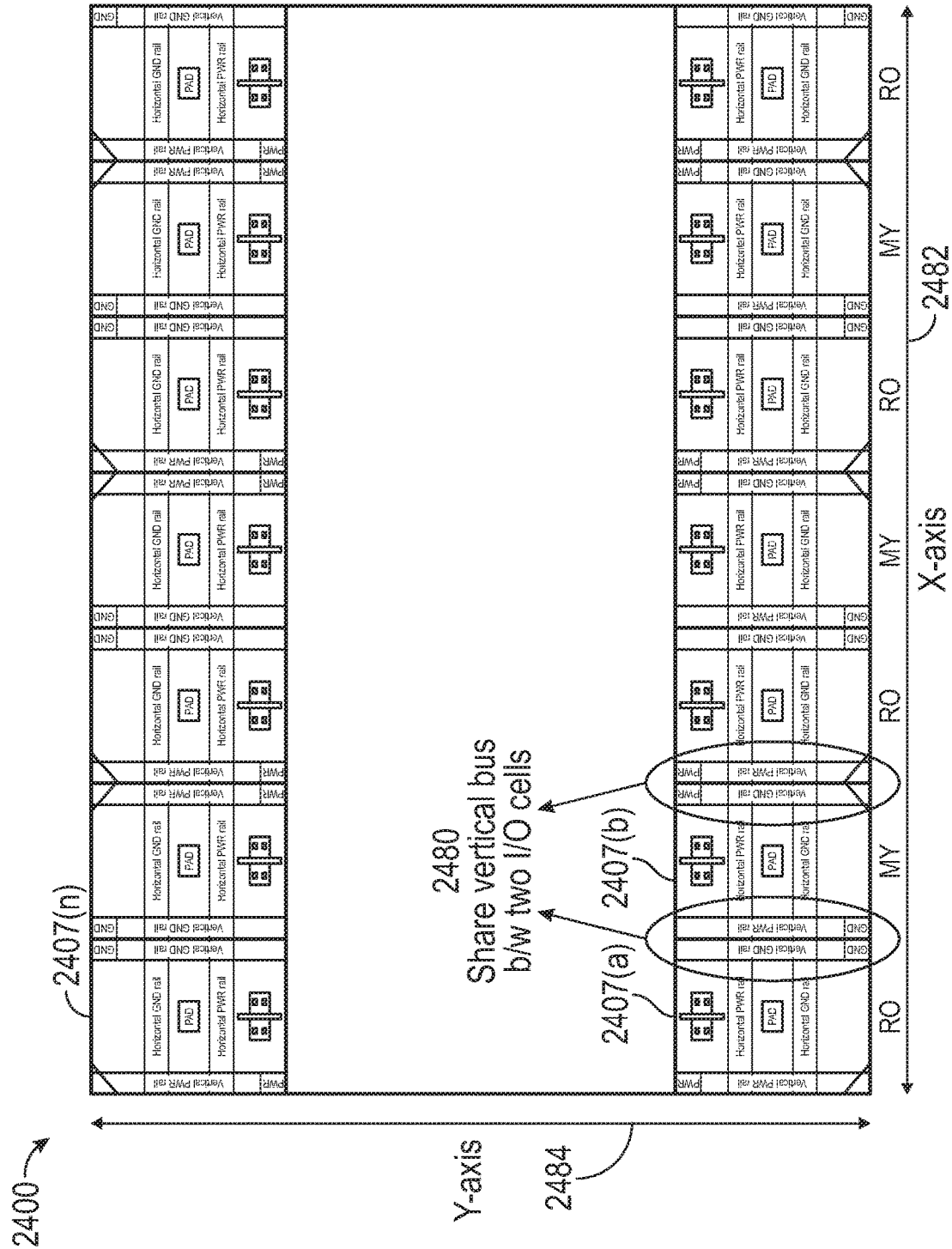
FIG. 24 shows an I/O cell placement in an I/O ring having a shared vertical bus between two adjacent I/O cells.

FIG. 24 shows an I/O ring 2400 having a shared vertical bus between two I/O cells. The I/O ring 2400 has a plurality of I/O cells 2307(a) . . . (n) (where "n" is any suitable number). The I/O cell 2407(b) is flipped about its Y-axis and abuts I/O cell 2407(a) such that the vertical bus of I/O cell 2407(a) is shared with I/O cell 2407(b), as shown by shared vertical bus 2480. X-axis 2482 and Y-axis 2484 are also shown.

Figures 25A, 25B:
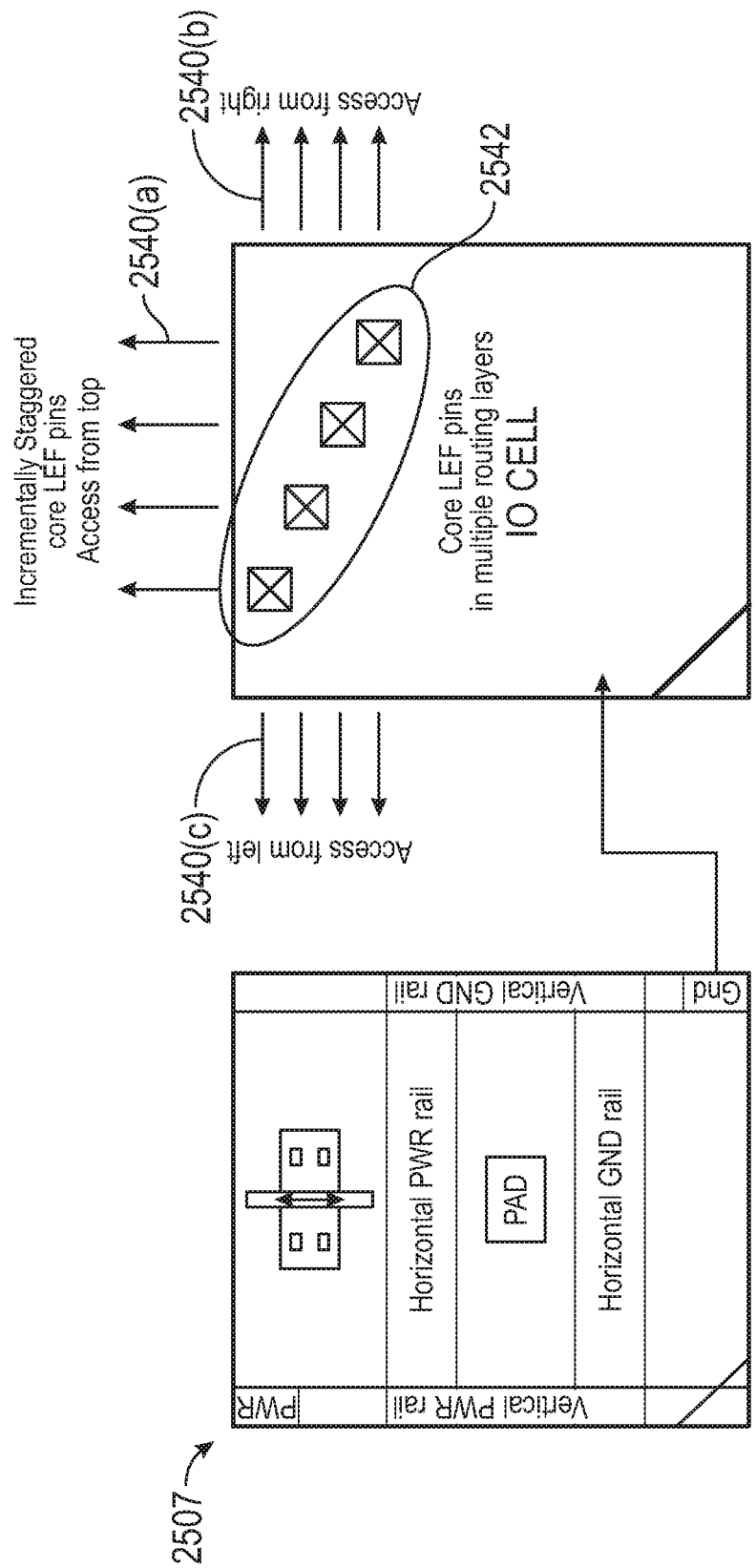
FIGS. 25A and 25B show an I/O cell and an I/O cell with incrementally staggered core LEF pins, respectively.

FIGS. 25A and 25B show an I/O cell and an I/O cell having incrementally staggered core LEF pins, respectively. The I/O cell 2507 shown in FIG. 25A includes many of the components discussed herein and therefore these components are not repeated with respect to FIG. 25A. FIG. 25B shows the I/O cell with a plurality of staggered LEF pins, generally 2542. The staggered pins 2542 are accessed from three directions, 2540(a) (top), 2540(b) (right) and 2540(c) (left).

Figure 26:
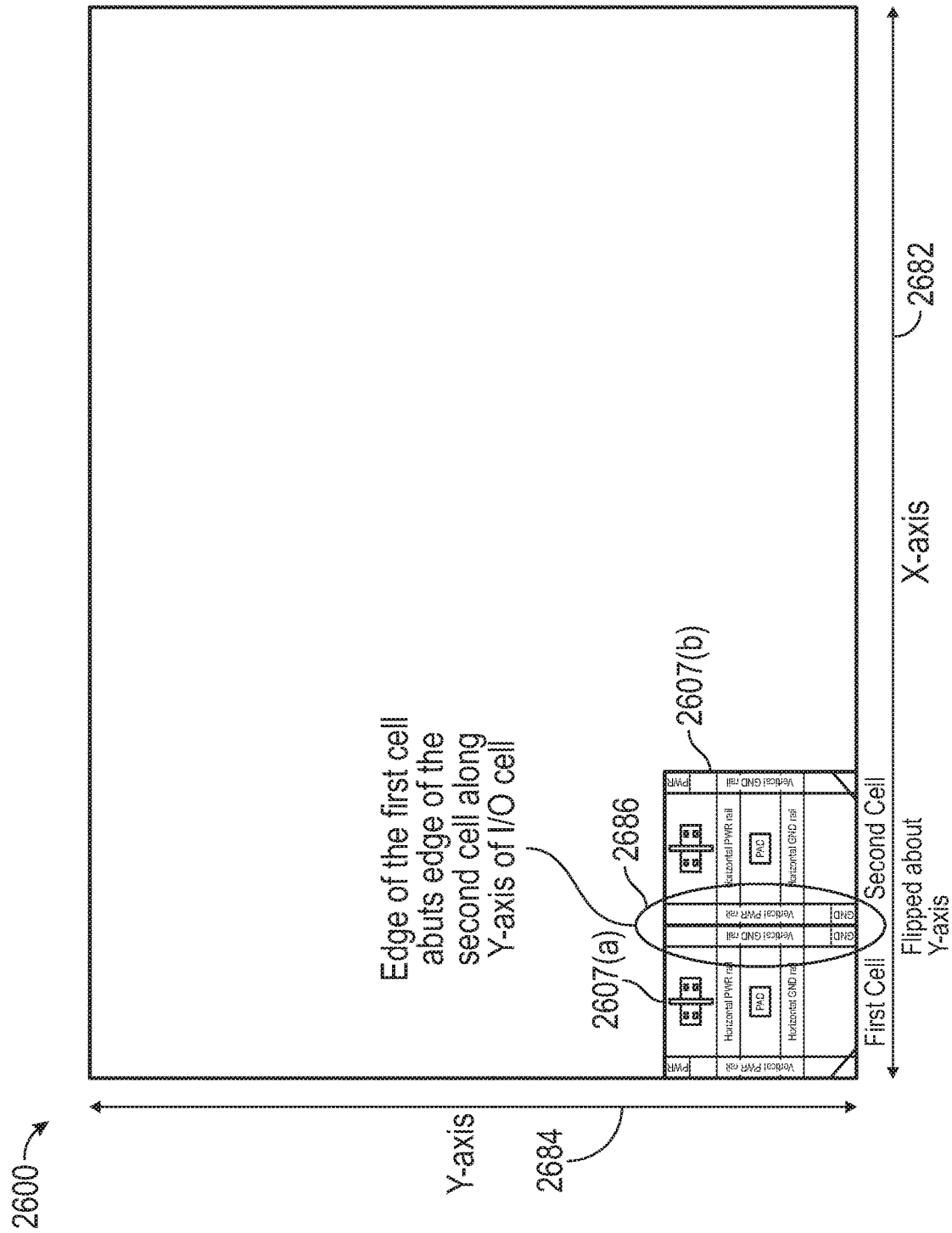
FIG. 26 shows an I/O cell in which the edge of the first cell abuts the edge of a second cell along the Y-axis of the I/O cell.

FIG. 26 shows I/O cells embodiment 2600 where along the X-axis 2682, the edge along the Y-axis 2684 of the first I/O cell 2607(a) abut 2686 the edge along the Y-axis 2684 of a second I/O cell 2607(b).

Figure 27:
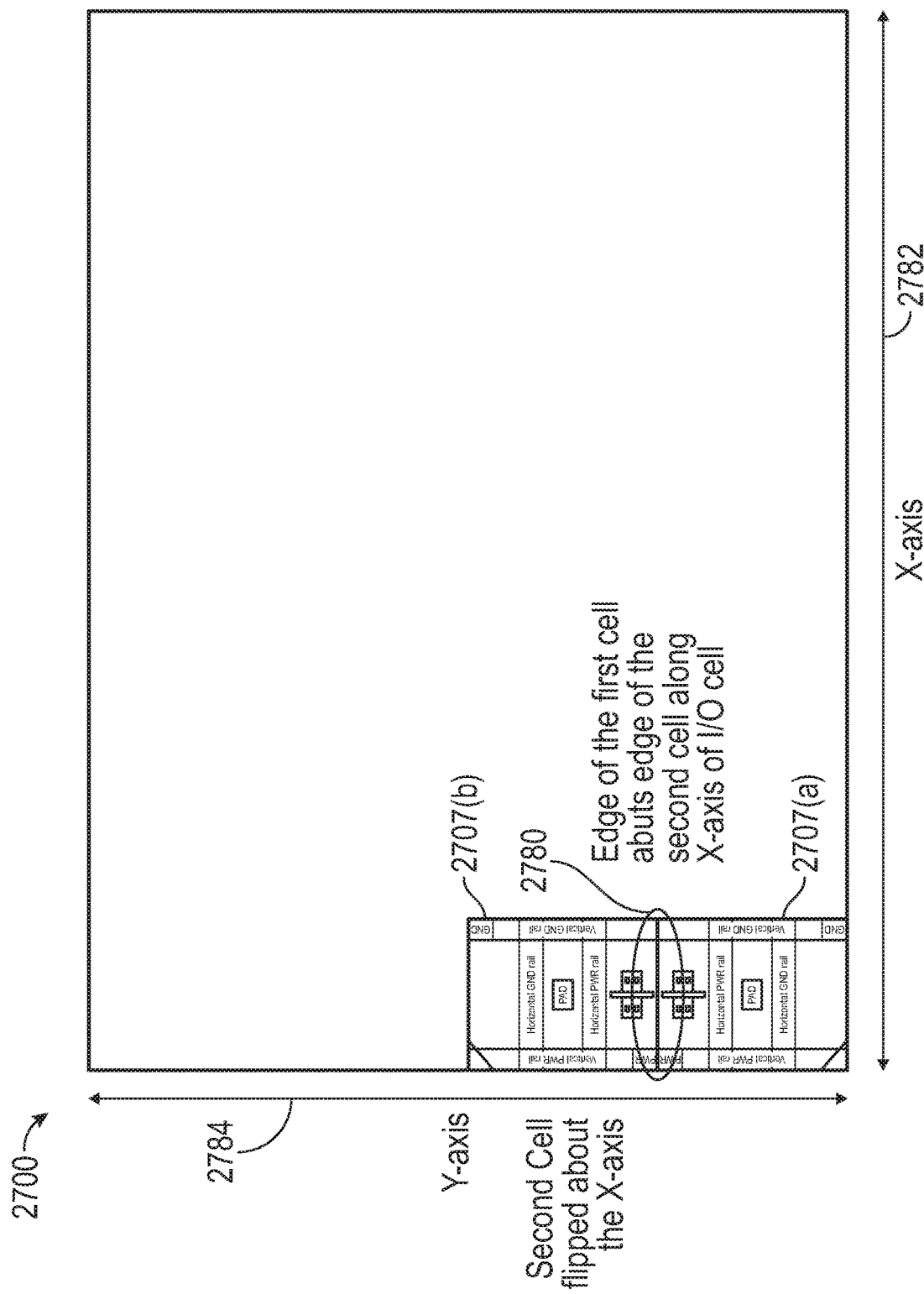
FIG. 27 shows an I/O cell in which the edge of the first cell abuts the edge of a second cell along the X-axis of the I/O cell.

FIG. 27 shows I/O cells embodiment 2700 where along the Y-axis 2784, the edge along the X-axis 2782 of the first I/O cell 2707(a) abut 2780 the edge along the X-axis 2782 of a second I/O cell 2707(b).

Unless stated otherwise, terms such as "first" and "second" are used to arbitrarily distinguish between the elements such terms describe. Thus, these terms are not necessarily intended to indicate temporal or other prioritization of such elements.

As will be appreciated by one skilled in the art, the disclosure may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the embodiments may take the form of a computer program product embodied in any tangible medium of expression having computer-usable program code embodied in the medium.

It can be seen that the apparatus, system and methodologies presented herein provide an advancement in the state of the art.

Accordingly, some of the disclosed embodiments are set out in the following items:

1. An apparatus comprising: two or more I/O cells, each I/O cell having a single layout form, each I/O cell having a first axis and a second axis; where each I/O cell has a power pin portion dimensioned to be one-half a designated power pin region; where each I/O cell has a ground pin portion dimensioned to be one-half a designated ground pin region; and where the two or more I/O cells are mounted adjacent on the first axis by flipping one or more alternate I/O cells about the second axis to share a bus between the two I/O cells.

2. The apparatus of item 1, where the first axis is the X-axis and the second axis is the Y-axis.

3. The apparatus of item 1, where the first axis is the Y-axis and the second axis is the X-axis.

4. The apparatus of item 1, where each I/O cell has a first dimension of approximately 50 micrometers, and a second dimension of approximately 50 micrometers.

5. The apparatus of item 1, where the single layout form is horizontal.

6. The apparatus of item 1, where the single layout form is vertical.

7. The apparatus of item 1, where each I/O cell has an incrementally staggered configuration of a plurality of core LEF pins to allow access to the plurality of core LEF pins from a plurality of directions.

8. The apparatus of item 7, where the plurality of directions are three directions.

9. A method for forming a composite I/O ring comprising: identifying one version of an I/O cell type; arranging a first cell of two or more I/O cells of the I/O cell type, including original I/O cells and alternate I/O cells, where each I/O cell has an X-axis and a Y-axis; flipping one or more alternate I/O cells about the X-axis of the alternate I/O cell; stacking the alternate I/O cell by abutting an edge of the alternate I/O cell to an edge of an adjacent original I/O cell along the X-axis of the alternate I/O cell and the X-axis of the original I/O cell; creating a composite I/O cell structure utilizing one or more of the original I/O cells and one or more of the alternate I/O cells; and forming an I/O ring from the composite I/O cell structure.

10. The method of item 9, where each I/O cell utilizes a power pin dimensioned approximately 50 percent of a dedicated region on the I/O cell.

11. The method of item 9, where each I/O cell utilizes a ground pin dimensioned approximately 50 percent of a dedicated region on the I/O cell.

12. The method of item 9, where the original I/O cell and the alternate I/O cell have aligned power rails.

13. The method of item 9, where each pin of the I/O cell is accessible from three sides of the I/O cell.

14. The method of item 9, where the one version of the I/O cell type is horizontal.

15. The method of item 9, where the one version of the I/O cell type is vertical.

16. A system comprising: two or more I/O cells, each I/O cell having a single layout design, each I/O cell having a first axis and a second axis; where each I/O cell has a power pin portion dimensioned to be one-half a designated power pin region; where each I/O cell has a ground pin portion dimensioned to be one-half a designated ground pin region; and where the two or more I/O cells are mounted adjacent on the first axis by flipping one or more alternate I/O cells about the second axis to share a bus between the two I/O cells.

17. The system of item 16, where the two or more I/O cells have aligned power rails.

18. The system of item 16, where the two or more I/O cells have aligned ground rails.

19. The system of item 16, where each pin of the I/O cell is accessible from three sides of the I/O cell.

20. The system of item 19, where the pin of the I/O cell is a core LEF pin.

The invention claimed is:

1. An apparatus comprising:
two or more I/O cells, each I/O cell having a single layout form, each I/O cell having a first axis and a second axis;
where each I/O cell has a power pin portion dimensioned to be one-half a designated power pin region;
where each I/O cell has a ground pin portion dimensioned to be one-half a designated ground pin region; and
where the two or more I/O cells are mounted adjacent on the first axis by flipping one or more alternate I/O cells about the second axis to share a bus between the two I/O cells.

2. The apparatus as claimed in claim 1, where the first axis is the X-axis and the second axis is the Y-axis.

3. The apparatus as claimed in claim 1, where the first axis is the Y-axis and the second axis is the X-axis.

4. The apparatus as claimed in claim 1, where each I/O cell has a first dimension of approximately 50 micrometers, and a second dimension of approximately 50 micrometers.

5. The apparatus as claimed in claim 1, where the single layout form is horizontal.

6. The apparatus as claimed in claim 1, where the single layout form is vertical.

7. The apparatus as claimed in claim 1, where each I/O cell has an incrementally staggered configuration of a plurality of core LEF pins to allow access to the plurality of core LEF pins from a plurality of directions.

8. The apparatus as claimed in claim 7, where the plurality of directions are three directions.

9. A method for forming a composite I/O ring comprising:
identifying one version of an I/O cell type;
arranging a first cell of two or more I/O cells of the I/O cell type, including original I/O cells and alternate I/O cells, where each I/O cell has an X-axis and a Y-axis;
flipping one or more alternate I/O cells about the X-axis of the alternate I/O cell;
stacking the alternate I/O cell by abutting an edge of the alternate I/O cell to an edge of an adjacent original I/O cell along the X-axis of the alternate I/O cell and the X-axis of the original I/O cell;
creating a composite I/O cell structure utilizing one or more of the original I/O cells and one or more of the alternate I/O cells; and
forming an I/O ring from the composite I/O cell structure, where each I/O cell utilizes a power pin dimensioned approximately 50 percent of a dedicated region on the I/O cell.

10. The method as claimed in claim 9, where each pin of the I/O cell is accessible from three sides of the I/O cell.

11. The method as claimed in claim 9, where the one version of the I/O cell type is horizontal.

12. The method as claimed in claim 9, where the one version of the I/O cell type is vertical.

13. A method for forming a composite I/O ring comprising:
identifying one version of an I/O cell type;
arranging a first cell of two or more I/O cells of the I/O cell type, including original I/O cells and alternate I/O cells, where each I/O cell has an X-axis and a Y-axis:
flipping one or more alternate I/O cells about the X-axis of the alternate I/O cell;
stacking the alternate I/O cell by abutting an edge of the alternate I/O cell to an edge of an adjacent original I/O cell along the X-axis of the alternate I/O cell and the X-axis of the original I/O cell;
creating a composite I/O cell structure utilizing one or more of the original I/O cells and one or more of the alternate I/O cells; and
forming an I/O ring from the composite I/O cell structure, where each I/O cell utilizes a ground pin dimensioned approximately 50 percent of a dedicated region on the I/O cell.

14. A method for forming a composite I/O ring comprising:
identifying one version of an I/O cell type;
arranging a first cell of two or more I/O cells of the I/O cell type, including original I/O cells and alternate I/O cells, where each I/O cell has an X-axis and a Y-axis;
flipping one or more alternate I/O cells about the X-axis of the alternate I/O cell;
stacking the alternate I/O cell by abutting an edge of the alternate I/O cell to an edge of an adjacent original I/O cell along the X-axis of the alternate I/O cell and the X-axis of the original I/O cell;
creating a composite I/O cell structure utilizing one or more of the original I/O cells and one or more of the alternate I/O cells; and
forming an I/O ring from the composite I/O cell structure, where the original I/O cell and the alternate I/O cell have aligned power rails.

15. A system comprising:
two or more I/O cells, each I/O cell having a single layout design, each I/O cell having a first axis and a second axis;
where each I/O cell has a power pin portion dimensioned to be one-half a designated power pin region;
where each I/O cell has a ground pin portion dimensioned to be one-half a designated ground pin region; and
where the two or more I/O cells are mounted adjacent on the first axis by flipping one or more alternate I/O cells about the second axis to share a bus between the two I/O cells.

16. The system as claimed in claim 15, where the two or more I/O cells have aligned power rails.

17. The system as claimed in claim 15, where the two or more I/O cells have aligned ground rails.

18. The system as claimed in claim 15, where each pin of the I/O cell is accessible from three sides of the I/O cell.

19. The system as claimed in claim 18, where the pin of the I/O cell is a core LEF pin.

\* \* \* \* \*